(12) United States Patent
Shibata et al.

(10) Patent No.: US 7,543,546 B2
(45) Date of Patent: Jun. 9, 2009

(54) PLASMA PROCESSING APPARATUS, METHOD FOR PRODUCING REACTION VESSEL FOR PLASMA GENERATION, AND PLASMA PROCESSING METHOD

(75) Inventors: Tetsuji Shibata, Hirakata (JP); Keiichi Yamazaki, Gose (JP); Noriyuki Taguchi, Otsu (JP); Yasushi Sawada, Neyagawa (JP)

(73) Assignee: Matsushita Electric Works, Ltd., Osaka (JP)

( * ) Notice: Subject to any disclaimer, the term of this patent is extended or adjusted under 35 U.S.C. 154(b) by 464 days.

(21) Appl. No.: 10/529,861

(22) PCT Filed: May 26, 2004

(86) PCT No.: PCT/JP2004/007598

§ 371 (c)(1),
(2), (4) Date: Mar. 31, 2005

(87) PCT Pub. No.: WO2004/107394

PCT Pub. Date: Dec. 9, 2004

(65) Prior Publication Data

US 2006/0042545 A1 Mar. 2, 2006

(30) Foreign Application Priority Data

May 27, 2003 (JP) ............................. 2003-149961
Sep. 22, 2003 (JP) ............................. 2003-330351

(51) Int. Cl.
*C23C 16/00* (2006.01)
(52) U.S. Cl. .................................. 118/723 E
(58) Field of Classification Search ............... 118/723 E; 156/345.43, 345.44, 345.45, 345.46, 345.47
See application file for complete search history.

(56) References Cited

U.S. PATENT DOCUMENTS 5,185,132 A * 2/1993 Horiike et al. ......... 422/186.05

(Continued)

FOREIGN PATENT DOCUMENTS

JP        04-358076 A1    12/1992

(Continued)

OTHER PUBLICATIONS

PCT International Search Report for PCT/JP2004/007598 mailed on Jan. 25, 2005.

(Continued)

*Primary Examiner*—Parviz Hassanzadeh
*Assistant Examiner*—Michelle Crowell
(74) *Attorney, Agent, or Firm*—Cheng Law Group PLLC

(57) ABSTRACT

A plasma treatment apparatus is provided, which enables to increase a treatment area and provide good treatment uniformity. This apparatus comprises a pair of electrode plates having a plurality of through holes and an insulating plate having a plurality of through holes. The insulating plate is disposed between the electrode plates such that positions of the through holes of the electrode plates correspond to the positions of the through holes of the insulating plate. A plurality of discharge spaces are formed by the through holes of the electrode plates and the through holes of the insulating plate. By applying a voltage between the electrode plates, while supplying a plasma generation gas into the discharge spaces, plasmas are generated simultaneously in the discharge spaces, and sprayed on an object to efficiently perform a large-area, uniform plasma treatment.

20 Claims, 14 Drawing Sheets

U.S. PATENT DOCUMENTS

| | | | |
|---|---|---|---|
| 5,543,688 A * | 8/1996 | Morita | 315/111.21 |
| 5,578,130 A * | 11/1996 | Hayashi et al. | 118/723 E |
| 5,795,452 A | 8/1998 | Kinoshita et al. | |
| 5,959,409 A * | 9/1999 | Dornfest et al. | 315/111.21 |
| 6,089,182 A | 7/2000 | Hama | |
| 6,244,211 B1 | 6/2001 | Nishikawa et al. | |
| 6,460,482 B1 | 10/2002 | Kuibira et al. | |
| 6,632,323 B2 * | 10/2003 | Kim et al. | 156/345.43 |
| 6,764,658 B2 * | 7/2004 | Denes et al. | 422/186.04 |
| 2002/0092616 A1 * | 7/2002 | Kim | 156/345.43 |
| 2002/0187066 A1 | 12/2002 | Yu et al. | |
| 2003/0070760 A1 * | 4/2003 | Kim et al. | 156/345.43 |
| 2007/0037408 A1 * | 2/2007 | Tachibana et al. | 438/778 |

FOREIGN PATENT DOCUMENTS

| | | |
|---|---|---|
| JP | 08-264462 A1 | 10/1996 |
| JP | 08-266854 A | 10/1996 |
| JP | 09-186135 A | 7/1997 |
| JP | 11-144892 A | 5/1999 |
| JP | 11-335868 A1 | 12/1999 |
| JP | 2000-332000 | 11/2000 |
| JP | 2001-038138 A | 2/2001 |
| JP | 2002-058995 A | 2/2002 |
| JP | 2002-253952 A | 9/2002 |
| JP | 2003-290623 A | 10/2003 |
| JP | 2004-227990 A | 8/2004 |

OTHER PUBLICATIONS

Notification of Reasons for Refusal for the Application No. 2004-155209 from Japan Patent Office, mailed May 27, 2008.

* cited by examiner

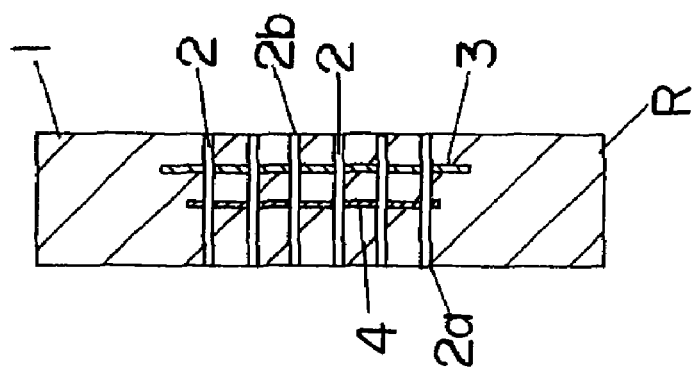
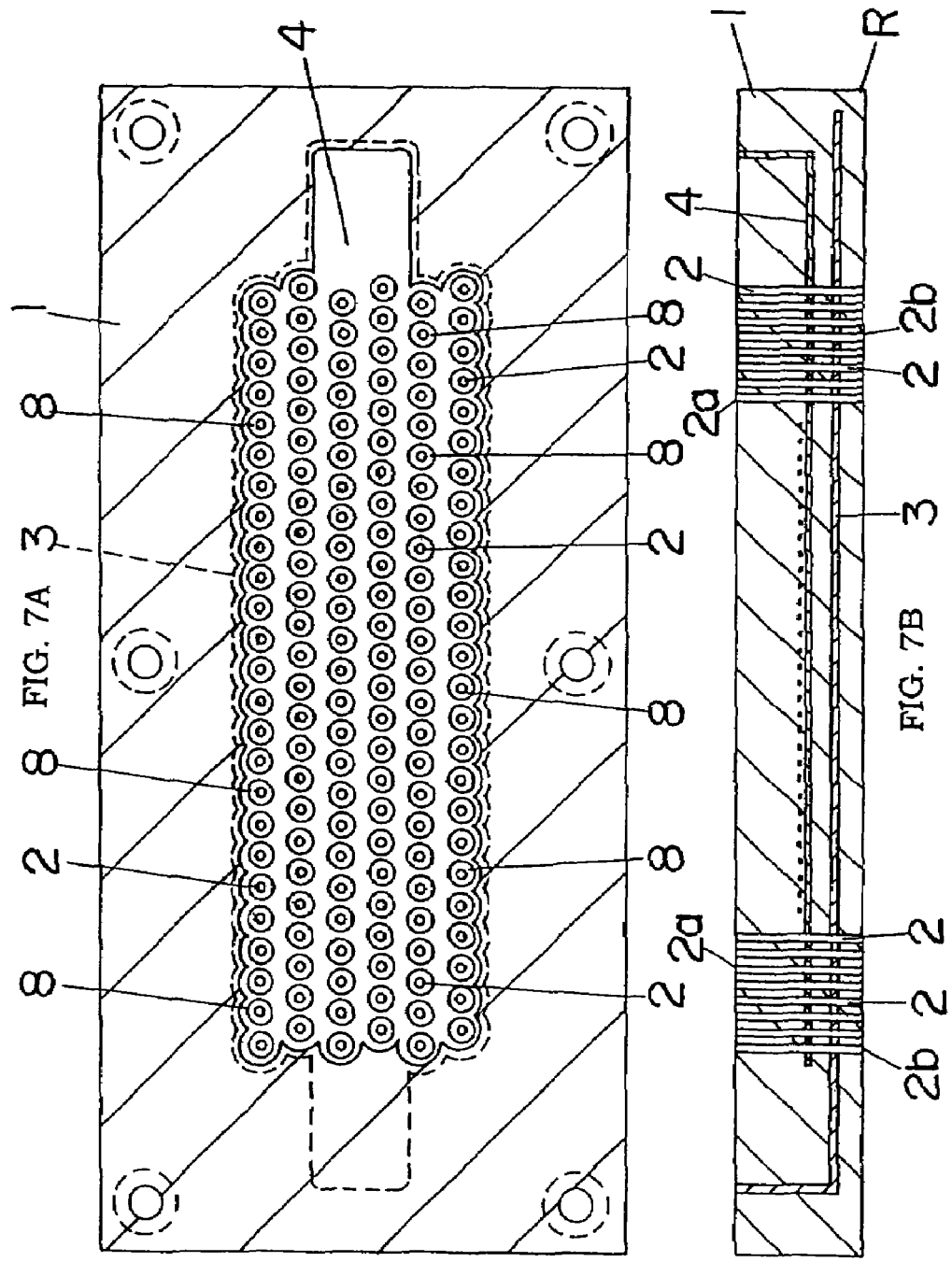
FIG. 7C
FIG. 7A
FIG. 7B

PLASMA PROCESSING APPARATUS, METHOD FOR PRODUCING REACTION VESSEL FOR PLASMA GENERATION, AND PLASMA PROCESSING METHOD

TECHNICAL FIELD

The present invention relates to plasma treatment apparatus and method for efficiently performing a large-area plasma treatment.

BACKGROUND ART

In the past, plasma surface treatments have widely used for the purposes of cleaning foreign substances such as organic materials on an object to be treated, etching or peeling resists, improving adhesion of organic films, reducing metal oxides, forming films, pretreatments for plating and coating, and surface modifications of various kinds of materials and parts.

For example, Japanese Patent Early Publication [kokai] No. 11-335868 discloses performing a surface treatment to objects with a plasma generated in a discharge space between a pair of electrodes by applying a voltage between the electrodes, while supplying a plasma generation gas into the discharge space. In this plasma surface treatment, since the plasma or activated species of the plasma is ejected from a single nozzle, and the objects are plasma treated, while being conveyed in a direction orthogonal to the ejecting direction, there is a problem that variations in treatment effect on the objects easily occur.

In addition, Japanese Patent Early Publication [kokai] No. 4-358076 discloses that a treatment area is increased by using a plasma or activated species of the plasma, which is generated by use of a reaction vessel with dielectric coated electrodes obtained by placing a solid dielectric material on surfaces of a plurality of electrodes disposed in parallel to each other. According to this technique, it is possible to perform a surface treatment to a large area of the object at a time. However, there is still plenty of room for improvement in the view of providing the plasma or the activated species of the plasma to the entire treatment area by a uniform gas flow. In addition, such a large-area plasma treatment has another problem that a large amount of consumption of the gas leads to an increase in running cost.

In addition, with respect to the object such as a glass for liquid crystal panel, it is desired to further increase the treatment area in the future. To cope with various kinds of objects, it is needed to increase the level of freedom in designing the apparatus.

SUMMARY OF THE INVENTION

In consideration of the above problems, a primary concern of the present invention is to provide a plasma treatment apparatus with a high level of freedom in designing the apparatus depending on the object to be treated, which has the capability of increasing a treatment area and performing a uniform treatment with a small consumption of a gas, i.e., a low running cost.

That is, in a plasma treatment apparatus for activating a plasma generation gas G by a discharge, and spraying an activated plasma generation gas on an object 5, the plasma treatment apparatus of the present invention is characterized by having a reaction vessel R formed by an insulating member 1, and comprising a plurality of through holes 2, each of which has an inflow opening for the plasma generation gas G at its one end, and an outflow opening for the activated plasma generation gas G at its opposite end, and electrodes 3, 4 for developing the discharge in each of the through holes 2.

According to the plasma treatment apparatus of the present invention, by developing a gas discharge in each of the through holes 2 at atmospheric pressure or a pressure in the vicinity of atmospheric pressure, and supplying a gas flow of the activated plasma generation gas G containing activated species generated by the gas discharge from the through holes 2 toward the object 5, it is possible to generate a uniform plasma with high efficiency over a large area, and uniformly performing a surface treatment to the large area of the object 5 with a small gas flow amount. In addition, by using an appropriate combination of a plurality of insulating members 1, it is possible to design a suitable plasma treatment apparatus with a high level of freedom depending on shape and size of the object 5.

In the above plasma treatment apparatus, it is preferred that the electrodes 3, 4 are formed in layers in the insulating member 1, and have apertures 8 at positions corresponding to the through holes, and wherein there is no deficit portion 30 between adjacent apertures 8 in the electrodes. In this case, since the occurrence of surface discharge 31 on the insulating member 1 can be reduced, and arc discharge is hard to develop from the surface discharge 31 to the object 5. Consequently, it is possible to reduce that the object 5 is damaged by the arc discharge.

In addition, it is preferred that the electrodes 3, 4 are formed in layers to face the insulating member 1, and an outer peripheral portion of one of the electrodes located at a downstream side in a gas-flow direction projects outward relative to the outer peripheral portion of the other electrode located at an upstream side in the gas-flow direction. In this case, it is possible to prevent the occurrence of surface discharge 31 on the insulating material 1 between the outer peripheral portions of the electrodes 3, 4, and at locations other than the apertures 8. Consequently, the damage of the object 5 resulting from the arc discharge can be further reduced.

In addition, it is preferred that the above plasma treatment apparatus further comprises a temperature regulator configured to control temperature of the insulating member 1 at a temperature where secondary electrons are easily emitted. In this case, the plasma generation density is increased by secondary electrons released from the insulating member 1. Therefore, it is possible to improve the plasma treatment efficiency, e.g., an efficiency of cleaning or modifying the object 5.

The plasma treatment apparatus according to a preferred embodiment of the present invention comprises:
a pair of electrode plates having a plurality of through holes;
an insulating plate having a plurality of through holes, which is disposed between the electrode plates such that positions of the through holes of the electrode plates correspond to the positions of the through holes of the insulating plate;
a gas supply unit configured to supply a plasma generation gas into a plurality of discharge spaces formed by the through holes of the electrode plates and the through holes of the insulating plate; and
a voltage applying unit configured to apply a voltage between the electrode plates to generate plasmas of the plasma generation gas simultaneously in the discharge spaces.

In addition, the plasma treatment apparatus according to a further preferred embodiment of the present invention comprises a tubular vessel having a pair of electrodes and an insulating plate disposed between the electrodes, gas supply unit configured to supply a plasma generation gas from one end of the tubular vessel, and a voltage applying unit configured to apply a voltage between the electrodes to generate a plasma of the plasma generation gas in the tubular vessel, thereby performing a surface treatment to an object with the plasma ejected from the other end of the tubular vessel. This apparatus is characterized in that the electrodes are provided by a pair of electrode plates having a plurality of through holes, the insulating plate has a plurality of through holes, the tubular vessel has a plurality of discharge spaces formed by the through holes of the electrode plates and the through holes of the insulating plate, and plasmas of the plasma generation gas are generated simultaneously in the discharge spaces by applying the voltage between the electrode plates, and ejected from the other end of the tubular vessel.

A further concern of the present invention is to provide a method of producing the reaction vessel R for plasma generation used in the plasma treatment apparatus described above. That is, this method comprises the steps of:

placing a conductive film formed by a conductive material between sheets having a plurality of openings and formed by an insulating material such that the openings of the sheets corresponds to each other; and performing integral molding of a resultant laminate, so that the insulating member 1, electrode (3, 4) and the through holes 2 are respectively provided by the sheets, conductive film and the openings of the sheets. According to this method, the reaction vessel R suitable for the plasma treatment apparatus described above can be easily produced. In addition, the through holes 2 and the electrode (3, 4) can be formed with accuracy.

Another concern of the present invention is to provide a plasma treatment method using the above plasma treatment apparatus. That is, this plasma treatment method comprises the steps of:

developing discharges in the through holes 2 by applying a voltage to the electrodes (3, 4), while flowing the plasma generation gas G from one ends to the other ends of the through holes 2, thereby generating plasmas in the through holes 2 to activate the plasma generation gas G; and spraying the activated plasma generation gas G from the other ends of the through holes 2 on a surface of the object 5. According to this method, it is possible to generate the plasma over a large area with high efficiency, and uniformly perform the surface treatment to the object 5 having such a large area with a small gas flow amount.

Additional features of the present invention and advantages brought thereby will be clearly understood from the best mode for carrying out the invention described below.

BRIEF EXPLANATION OF THE DRAWINGS

FIGS. 7A to 7C are schematic top and cross-sectional views of a plasma treatment apparatus according to another preferred embodiment of the present invention;

BEST MODE FOR CARRYING OUT THE INVENTION

Figure 1A:
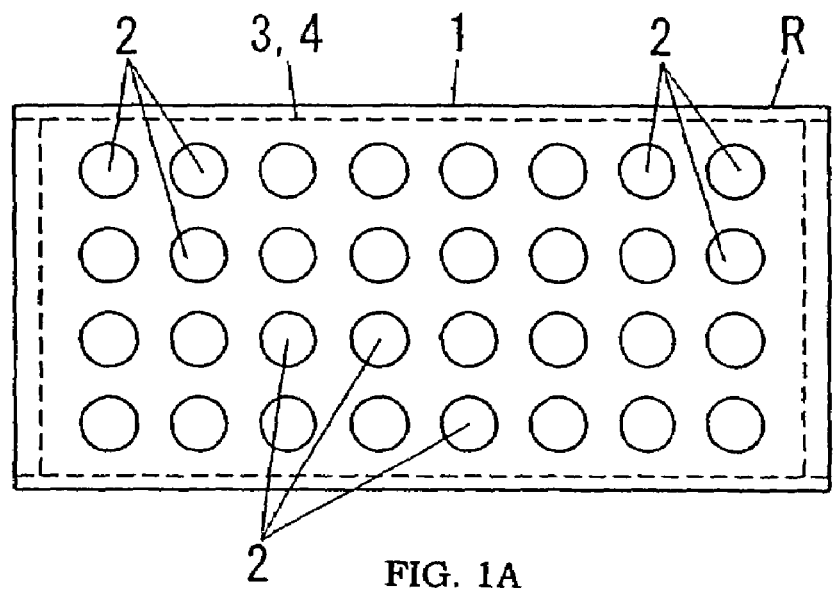
FIGS. 1A and 1B are schematic top and cross-sectional views of a plasma treatment apparatus according to a preferred embodiment of the present invention.

According to preferred embodiments, a plasma treatment apparatus, method of producing a reaction vessel for plasma generation, and a plasma treatment method of the present invention are explained in detail below.

Preferred embodiments of the plasma treatment apparatus of the present invention are shown in FIGS. 1A, 1B, 2A and 2B. These plasma treatment apparatuses have a reaction vessel R comprising a through holes 2 formed in a sheet-like insulating member 1, and a plurality (pair) of electrodes 3, 4 embedded in the insulating member 1.

It is preferred that the insulating member 1 is made of an insulating (dielectric) material having a high melting point. For example, it is possible to use a ceramic or a glass material having high heat resistance and high strength such as quartz glass, alumina, zirconia, mullite and aluminum nitride. The insulating member is not restricted to these materials. It is particularly preferred to use alumina in view of cost performance and high strength. Alternatively, a high dielectric material such as titania and barium titanate may be used. The electrodes 3, 4 can be made of an electroconductive metal material such as copper, tungsten, aluminum, brass and a stainless steel. In particular, it is preferred to use tungsten or copper. The materials of the insulating member 1 and the electrodes 3, 4 are preferably selected such that a difference in linear expansion coefficient therebetween is minimized to prevent the occurrence of a breakage due to a difference in deformation amount between the insulating member and the electrodes at the time of producing the reaction vessel R or when a thermal load is applied in the plasma treatment, which causes, to the reaction vessel.

Shapes of the insulating member 1 and the through holes 2 can be appropriately designed. For example, the insulating member 1 is configured in a sheet shape. In the figures, the insulating member 1 is of a rectangular sheet shape in a plan view thereof. The through holes 2 each having a circular shape in the plan view penetrate in the thickness direction of the insulating member 1. Opposite ends of each of the through holes 2 provide openings in the opposite surfaces of the insulating member 1. One of the openings works as a gas inflow port 2a, and the other opening works as an gas outflow port 2b.

The through holes 2 can be formed in an appropriate shape. For example, the through holes 2 each having the circular shape in the plan view can be arranged in a two-dimensional pattern. Alternatively, the through holes 2 each having a rectangular shape (slit-like shape) may be arranged in parallel to each other. In particular, when the through holes 2 each having the circular shape are arranged in the two-dimensional pattern, it is possible to uniformly spray the activated plasma generation gas G on a large area, while controlling a flow amount (flow rate) per unit time of the plasma generation gas G, under a condition that the diameter and pitch of the through holes 2 are appropriately designed.

In addition, the electrodes 3, 4 are formed to generate discharges in the through holes 2 when a voltage is applied therebetween. For example, an electric power source 6 is connected between the electrodes 3, 4, and a pulse-like voltage with a rest period is applied between the electrodes 3, 4. One of the electrodes may be used an a ground electrode. A space between the electrodes in each of the through holes 2 is defined as a discharge space. As described above, shapes of the electrodes 3, 4 can be appropriately configured to generate the discharges in the discharge spaces. For example, it is preferred that the electrodes 3, 4 are embedded in the insulating member 1, and positioned adjacent to the respective through holes 2. A fine formation of the through holes 2 and the electrodes 3, 4 further facilitates the uniformity of the surface treatment.

In FIGS. 1A, 1B, 2A and 2B, opposite surfaces of the insulating member 1 are positioned at top and bottom sides, and the through holes 2 each having the circular shape penetrate in the up and down direction, so that the gas inflow port 2a and the gas outflow port 2b are respectively provided by the openings formed in the top and bottom surfaces of the insulating member 1. The openings of the through holes 2 are arranged in the two-dimensional pattern at the top and bottom surfaces of the insulating member 1. In the figures, the through holes 2 are arranged in a tetragonal lattice pattern such that an interval between adjacent through holes 2 is constant.

The arrangement of the though holes 2 is not restricted, and can be arranged in an optional pattern. For example, when the through holes 2 are arranged in a hexagonal close packed (staggered) pattern in the plan view, they can be closely and uniformly arranged. As a result, it is possible to further improve the uniformity of the surface treatment on the object 5.

The size of the through holes 2 and the interval between the adjacent through holes 2 are appropriately determined such that the plasma generation gas is efficiently activated by the discharges in the through holes 2, and the activated plasma generation gas is uniformly ejected from the through holes 2. In particular, it is preferred that a diameter (inner diameter) of the through hole 2 is in a range of 0.01 to 15 mm. In this case, it is possible to provide a large-area surface treatment with a controlled flow amount of the plasma generation gas. In addition, it is preferred that the interval between the adjacent through holes 2 is in a range of 0.03 to 60 mm. For example, in the case of performing the plasma treatment to the object 5 having a relatively small area, the through holes 2 are preferably designed to have a relatively small diameter.

Figure 3A:
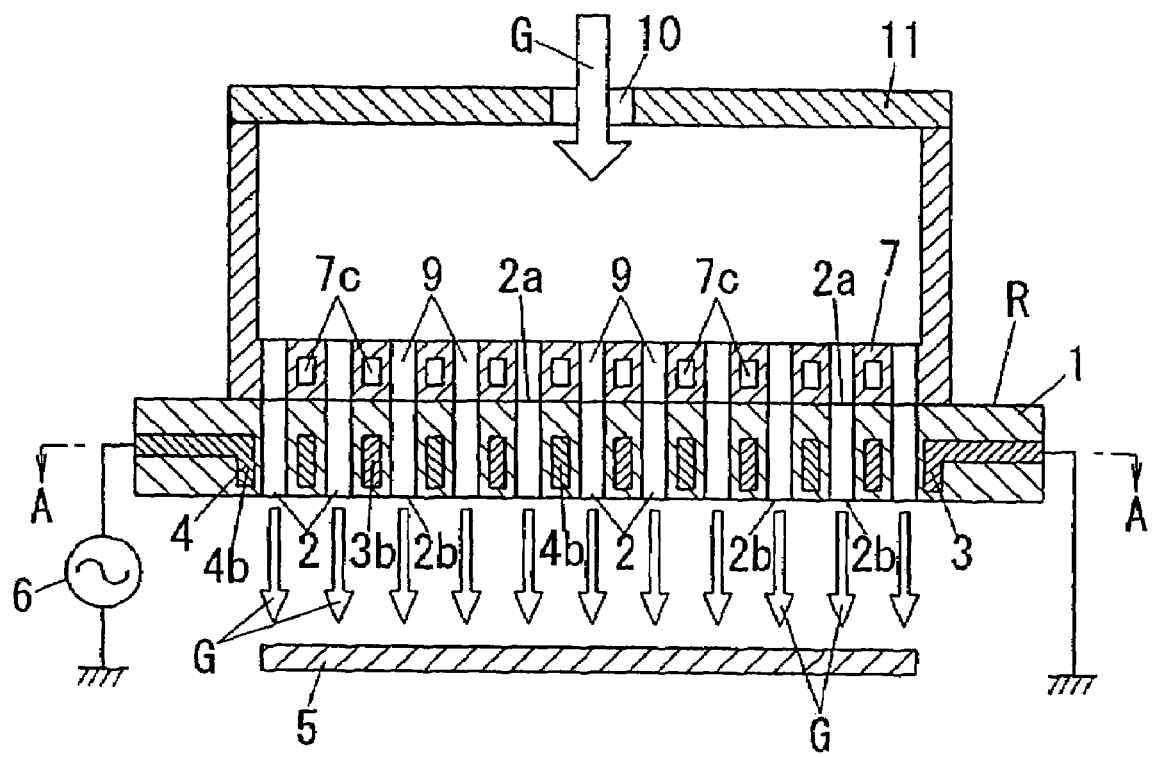
FIG. 3A is a cross-sectional view of a plasma treatment apparatus according to a further preferred embodiment of the present invention.
Figure 3B:
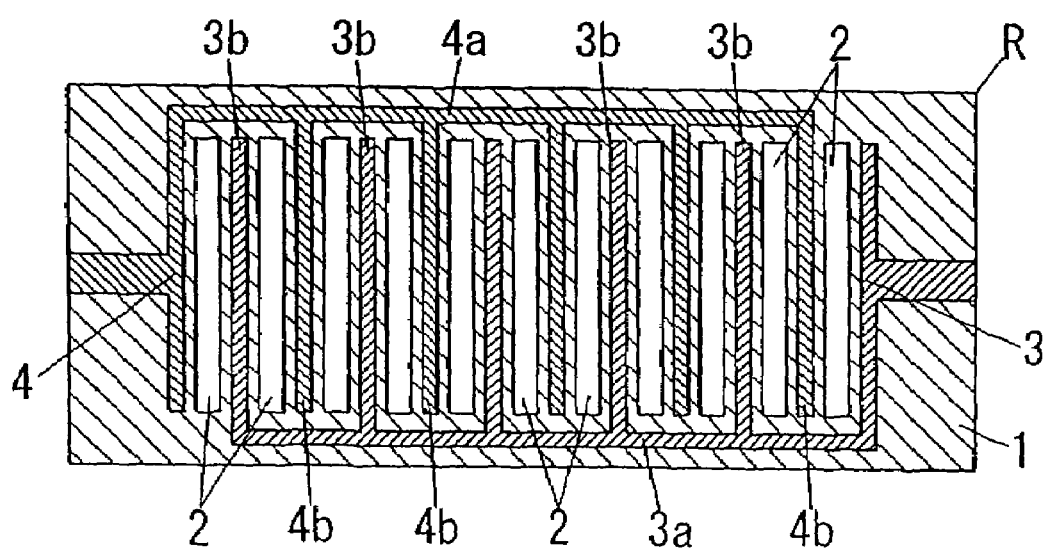
FIG. 3B is a cross-sectional view taken along the line A-A in FIG. 3A.

In the embodiment shown in FIGS. 3A and 3B, opposite surfaces of the insulating member 1 are positioned at top and bottom sides, and the through holes 2 each having a rectangular (slit-like) shape in the plan view penetrate in the up and down direction, so that the gas inflow port 2a and the gas outflow port 2b are respectively provided by openings formed in the top and bottom surfaces of the insulating member 1. The openings of the through holes 2 are arranged in a parallel pattern at the top and bottom surfaces of the insulating member 1 such that and a distance between adjacent through holes 2 is constant.

The size of the through hole 2 and the interval between the adjacent through holes 2 are appropriately determined such that the plasma generation gas is efficiently activated by the discharges in the respective through holes 2, and the activated plasma generation gas G is uniformly ejected from the through holes 2. In particular, it is preferred that a width (short side) size of the rectangular through hole 2 is in a range of 0.01 to 15 mm. In this case, it is possible to further improve the uniformity of the surface treatment by performing the plasma treatment to the object 5 being conveyed in the short-side direction of the through hole 2.

In addition, it is preferred that the interval between the adjacent through holes 2 is in a range of 0.01 to 30 mm. In this case, the activated plasma generation gas G can be continuously ejected along the longitudinal direction of the through holes from the gas outflow ports 2b of the through holes 2. Therefore, in the case of performing the plasma treatment to the object 5 being conveyed in the short-side direction of the through hole 2, the uniformity of the surface treatment can be further improved.

In the embodiments shown in FIGS. 1A, 1B, 2A and 2B, both of the electrodes 3, 4 are embedded in the insulating member 1. The electrode 4 is disposed at a side of the top surface of the insulating member 1 (i.e., the surface side having the gas inflow port 2a), and the electrode 3 is disposed at the side of the bottom surface of the insulating member 1 (i.e., the surface side having the gas outflow port 2b). The electrode 3 is spaced from the electrode 4 in a direction parallel to a flowing direction of the plasma generation gas G in the through hole 2. The insulating (dielectric) material constructing the insulating member 1 lies between the electrodes 3, 4.

In this case, the electrodes 3, 4 are formed in layers in the insulating member 1 such that positions of a plurality of apertures 8 of the electrodes 3, 4 correspond to the positions of the through holes 2 of the insulating member 1, and each of the through holes 2 is surrounded by the corresponding apertures 8 of the electrodes 3, 4. In comparison with the case of separately forming the electrodes 3, 4 every through hole 2, the apertures 8 are formed in each of the sheet-like electrodes 3, 4, so that the inner surfaces of the apertures 8 of the electrodes 3, 4 are used as discharge surfaces for developing the discharges in the through holes 2.

Figure 1B:
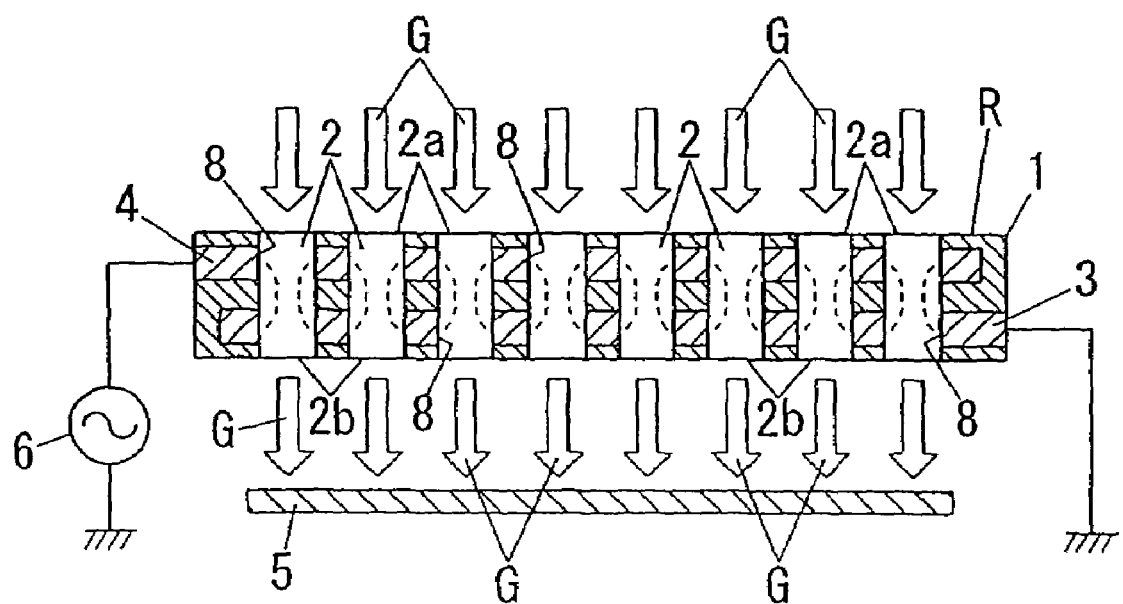

In the embodiment shown in FIG. 1B, since a diameter of the apertures 8 of the electrodes 3, 4 is equal to the diameter of the through holes 2, the inner surface of the respective through hole of the insulating member 1 is flush with the inner surfaces of the apertures 8 of the electrodes 3, 4. Therefore, the inner surfaces of the apertures 8 of the electrodes 3, 4 are exposed to the interior of the respective through hole 2. In this case, it is possible to easily develop the discharge by applying the voltage between the electrodes, and increase the density of activated species in the plasma generation gas G to improve the treatment efficiency. When the plasma generation gas G does not contain a reactive gas, it is preferred that the electrodes 3, 4 are exposed because damages of the exposed electrodes 3, 4 caused by the discharges are relatively small, and the discharges are easily developed.

Figure 2A:
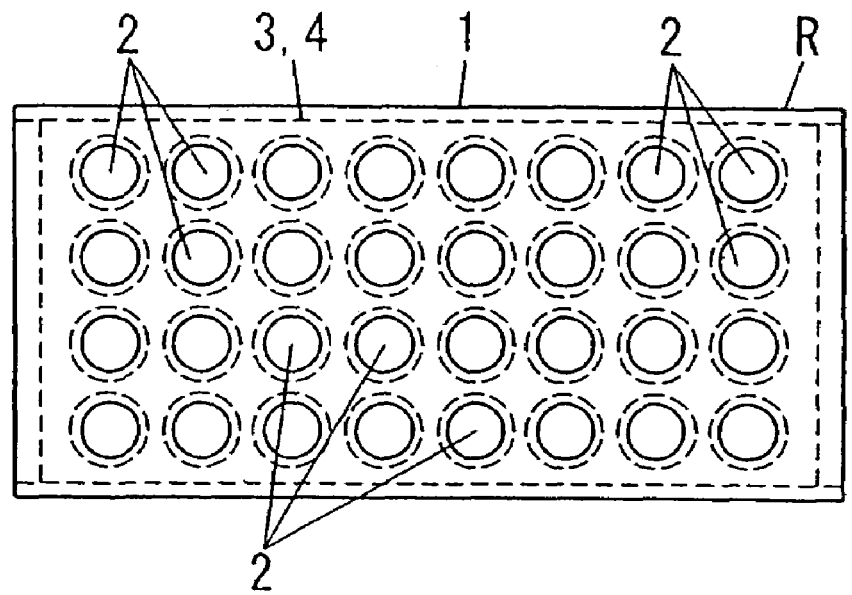
FIGS. 2A and 2B are schematic top and cross-sectional views of a plasma treatment apparatus according to another preferred embodiment of the present invention.
Figure 2B:
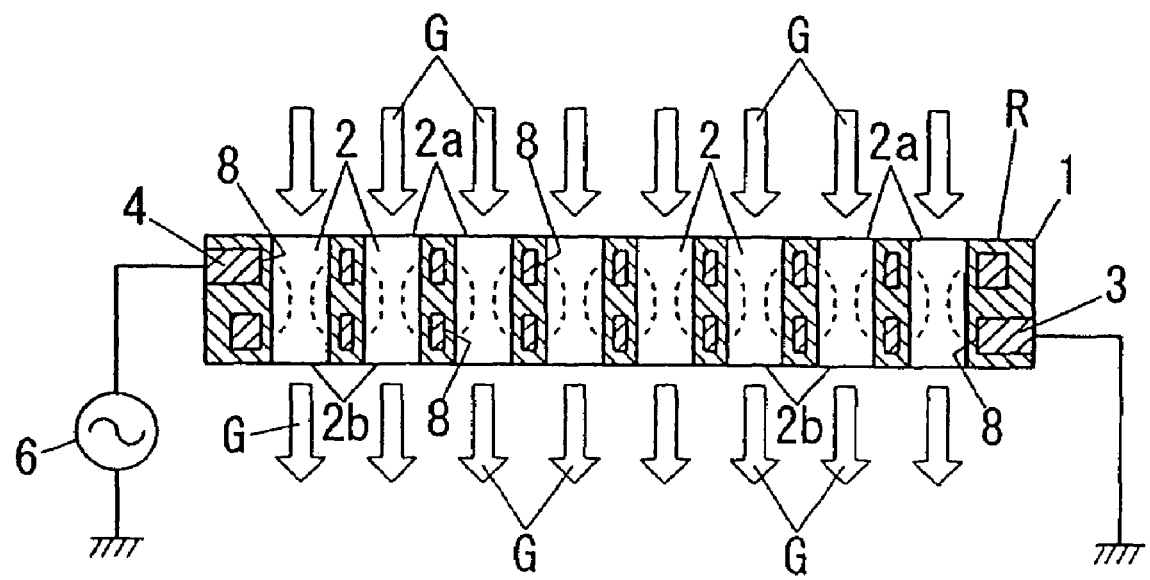

In the embodiment shown in FIGS. 2A and 2B, the diameter of the apertures 8 of the electrodes 3, 4 is larger than the diameter of the through holes 2, and the inner surfaces in the apertures 8 of the electrodes 3, 4 are covered by the insulating member 1. That is, the electrode 3, 4 are not exposed to the interiors of the through holes 2. In this case, when the voltage applied between the electrodes 3, 4, a dielectric barrier discharge is developed in each of the through holes 2. Therefore, the electrodes 3, 4 are not directly exposed to the generated plasma or the discharge. In other words, since the discharge surfaces of the electrodes 3, 4 are protected by the insulating (dielectric) material constructing the insulating member 1, it is possible to prevent the damages of the electrodes 3, 4. It is particularly effective in the case of using the plasma generation gas G containing a reactive gas.

In addition, there is another advantage of stabilizing the discharge, and increasing the plasma generation density. When the electrodes 3, 4 are exposed, there is a possibility that the discharge becomes unstable due to the occurrence of arc discharge at the time of applying a high voltage. On the other hand, when the electrodes 3, 4 are covered with the insulating (dielectric) material, the occurrence of arc discharge can be effectively prevented to stably maintain the discharge. A thickness of the insulating (dielectric) material formed on the inner surfaces of the electrodes 3, 4 is appropriately determined. To sufficiently protect the electrode's surface, and allow the discharge to easily develop, it is preferred that the thickness is in a range of 0.01 to 3 mm. In addition, it is preferred that a distance between the electrodes 3, 4 (i.e., the interval between the discharge surfaces) is in a range of 0.01 to 5 mm to stably generate the gas discharge (plasma).

As described above, when the electrodes 3, 4 are spaced from each other in the direction parallel to the flowing direction of the plasma generation gas G in the respective through hole 2, electric flux lines developed in the through hole 2 by a potential difference between the electrodes 3, 4 have a direction parallel to the flowing direction of the plasma generation gas G. At this time, a high density streamer discharge can be generated at the discharge space in the through hole 2 in the direction parallel to the flowing direction of the plasma generation gas G. This discharge increases the density of activated species in the plasma generation gas G, and therefore further improve the efficiency of the plasma surface treatment. In the embodiments shown by the drawings, since the discharge surfaces of the electrodes 3, 4 extend over the circumference of the through hole 2, the electric flux lines are generated over the circumference of the through hole 2. As a result, it is possible to obtain the plasma with a high efficiency.

In addition, when the electrode 3 disposed at the side of the gas outflow port 2b is formed by a ground electrode, which means that the electrode disposed at the side of the object to be treated is the ground electrode, it is possible to prevent the occurrence of arc discharge between the electrode 3 and the object 5 by controlling the potential difference therebetween. As a result, it is effective to avoid a situation that the object 5 is damaged by the discharge.

It is preferred that the above-described electrodes 3, 4 formed in layers have no deficit (penetrating) portion except for the apertures 8. That is, FIGS. 5A and 5B respectively show embodiments of the electrodes 3, 4 formed in the insulating member 1 shown in FIG. 2B. In this case, it is preferred to use the electrodes 3, 4 of FIG. 5B where no deficit portion 30 exist around the apertures 8 rather than the electrodes 3, 4 of FIG. 5A where a plurality of deficit portions 30 are formed around the apertures 8.

Figure 5A:
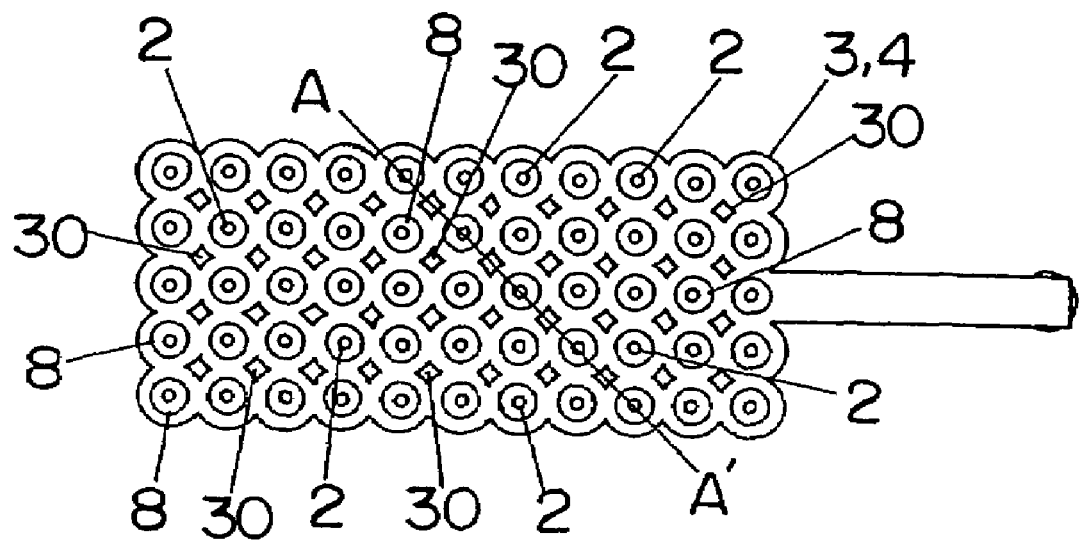
FIGS. 5A and 5B are top views of the electrodes according to preferred embodiments of the present invention.
Figure 5B:
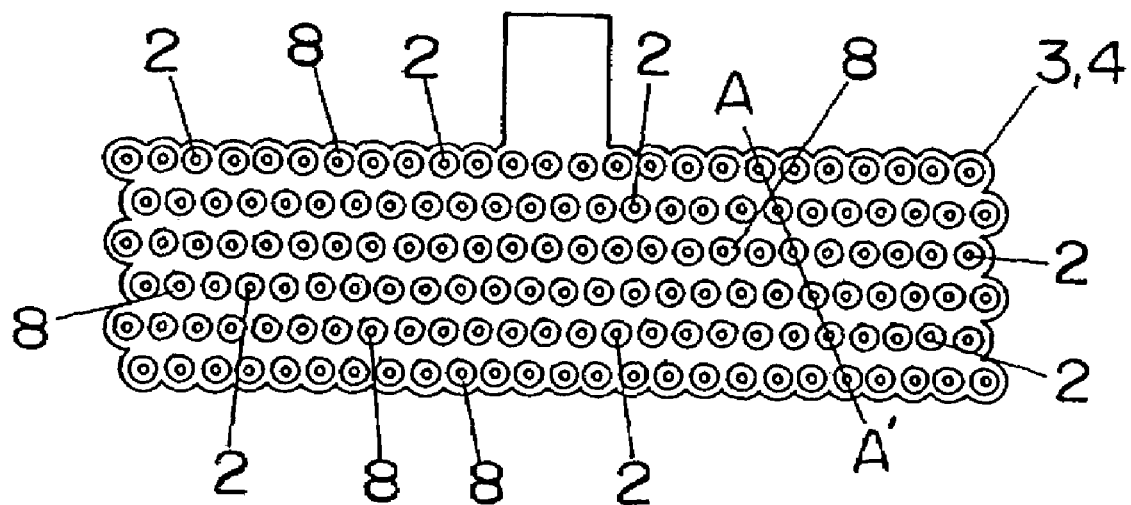
Figure 6A:
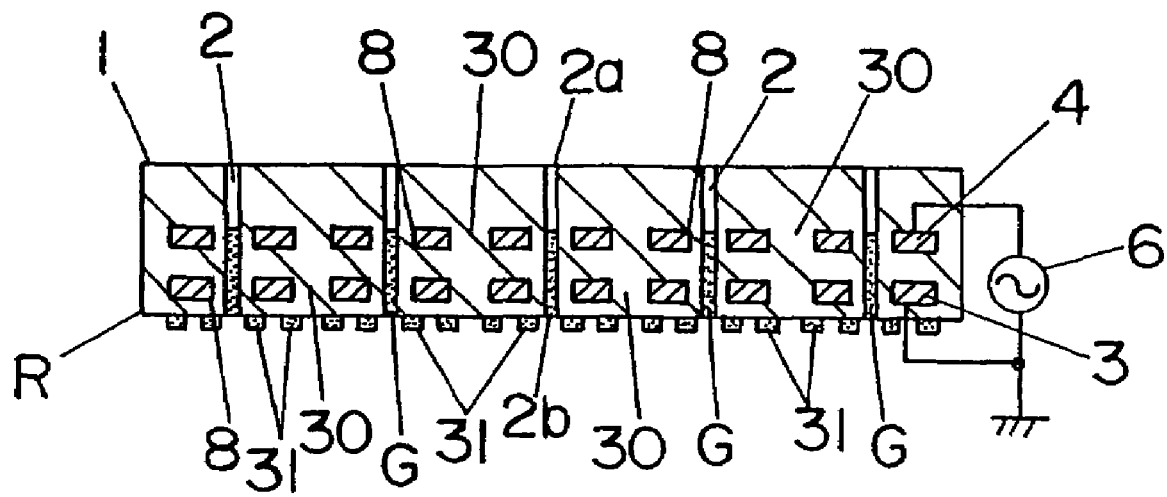
FIGS. 6A and 6B are cross-sectional views taken along the line A-A' in FIGS. 5A and 5B, respectively.
Figure 6B:
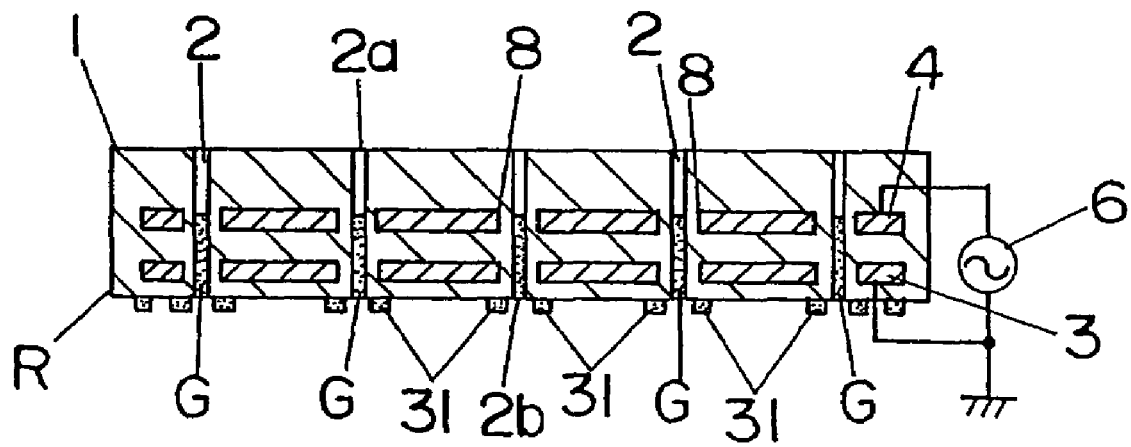

In the case of applying a voltage between the electrodes 3, 4 of FIG. 5A in the insulating member 1 by use of the electric power source 6, surface discharges 31 occur at locations corresponding to the apertures 8 and locations corresponding to the deficit portions 30 on the bottom surface of the insulating member 1, as shown in FIG. 6A. On the other hand, when applying the voltage between the electrodes 3, 4 of FIG. 5B in the insulating member 1 by use of the electric power source 6, the surface discharges 31 merely occur at the locations corresponding to the apertures 8 on the bottom surface of the insulating member 1, as shown in FIG. 6B. Therefore, it is possible to reduce the surface discharges 31, as compared with case of FIG. 6A.

The surface discharge 31 is a discharge generated at the location close to the object (work) 5. Therefore, as the surface discharges increases, arc discharges easily appear from the surface discharges 31 toward the object 5. In the insulating member 1 of FIG. 6B, since the surface discharges can be decreased, as compared with the case of FIG. 6A, the arc discharge is hard to appear. As a result, it is possible to minimize that the object 5 is damaged by the discharge.

With respect to the electrodes 3, 4 formed in layers, it is preferred that an outer peripheral portion of the electrode 3 located at a side near the object projects outward relative to the outer peripheral portion of the electrode 4 disposed at the side far from the object 5. That is, in an orthogonal projection view of the insulating member 1 having the pair of the electrodes 3, 4 therein, as shown in FIGS. 7A to 7C, the upper electrode 4 is of a substantially similar shape to the lower electrode 3 shown by the dotted line in FIG. 7A, and the electrodes 3, 4 are preferably formed in such a size that the upper electrode 4 can be overlapped in the area of the lower electrode 3. Thus, when the area of the lower electrode 3 is larger than the area of the upper electrode 4, the outer peripheral portion of the lower electrode 3 projects outside relative to the outer peripheral portion of the upper electrode 4, as shown in FIGS. 7A and 7B. In this case, the voltage between the outer peripheral portions of the electrodes 3, 4 is allowed to be smaller than the voltage between the electrodes 3, 4 in the through hole 2, thereby preventing the occurrence of surface discharges 31 at locations corresponding to the outer peripheral portions of the electrodes 3, 4 on the bottom surface of the insulating member 1. In other words, it is possible to prevent the occurrence of the surface discharges 31 at other than the locations corresponding to the apertures 8, and further reduce that the object 5 is damaged by arc discharge. In FIG. 7B, some of the through holes are not drawn. The electrodes 3, 4 can be formed in an appropriate shape other than the above shape. In addition, a plurality of electrodes 3, 4 may be arranged in a direction (e.g., a perpendicular direction) intersecting with the flowing direction of the plasma generation gas G in the through holes 2.

In the embodiment shown in FIGS. 3A and 3B, the electrodes 3, 4 are disposed in the insulating member 1 in such a pattern that one of the electrodes is spaced at the same level from the other electrode. That is, the electrode 4 is located at one side of the respective through hole 2, and the electrode 3 is located at the opposite side of the respective through hole 2. In the embodiment shown by the drawings, both of the electrodes 3, 4 are embedded in the insulating member 1, and lie at the same level in the insulating member 1. The electrodes 3, 4 are spaced from each other in a (perpendicular) direction intersecting with the flowing direction of the plasma generation gas G. The insulating (dielectric) material constructing the insulating member 1 lies between the electrodes 3, 4.

In the embodiment, the electrodes 3, 4 are formed in the insulating member 1. That is, each of the electrodes 3, 4 is formed in a comb-like shape with a feed portion (3a, 4a) extending along the arrangement of the through holes 2, and a plurality of electrode portions (3b, 4b) extending in the longitudinal direction of the respective through hole 2. The electrode portions (3b, 4b) of the electrodes 3, 4 are alternately disposed between adjacent through holes 2. Therefore, the electrode portion 4b is located at one side of the through hole 2, and the electrode portion 3b is located at the opposite side of the through hole 2. Thus, the electrode portions 3b, 4b are respectively integrally formed in the sheet-like electrodes 3, in stead of separately forming the electrodes 3, 4 every through hole 24. Therefore, side surfaces of the electrode portions 3b, 4b are used as the discharge surfaces for developing the discharges in the through holes 2.

To stably develop the gas discharge (plasma), it is preferred that the distance between the electrodes 3, 4 is in a range of 0.01 to 5 mm. In this case, electric flux lines developed in the through hole 2 by a potential difference between the electrodes 3, 4 have a direction intersecting with the flowing direction of the plasma generation gas G, as shown by the arrows in FIG. 4B. At this time, the discharge is developed in the intersecting direction to activate the plasma generation gas G.

In the embodiment shown in FIGS. 3A and 3B, a distance between adjacent electrode portions (3b, 4b) of the electrodes 3, 4 is larger than the width side of the through hole 2. Therefore, the electrode portions are completely embedded in the insulating member 1. In other words, the electrodes portions 3b, 4b are not exposed to the interiors of the through holes 2. In this case, since the discharge surfaces of the electrodes 3, 4 are protected by the insulating (dielectric) material constructing the insulating member 1, as in the case of FIGS. 2A and 2B, it is possible to effectively prevent the occurrence of the damages of the electrodes 3, 4. In addition, it is preferred that the coating thickness of the insulating (dielectric) material on the electrodes 3, 4 is in a range of 0.01 to 3 mm.

Although it is not shown by the drawings, the distance between adjacent electrode portions (3b, 4b) of the electrodes 3, 4 may be equal to the width side of the through hole 2. In this case, surfaces of the electrode portions 3b, 4b are flush with the inner surface of the through hole 2 of the insulating member 1, so that the electrode portions 3b, 4b are exposed to the interior of the respective through hole 2. As a result, as in the case of FIG. 1B, it is possible to increase the density of activated species in the plasma generation gas G, and improve the treatment efficiency.

In the case of using the slit-like through holes 2 shown in FIGS. 3A and 3B, although it is not shown by the drawings, the electrode 4 can be disposed at the side of the top surface of the insulating member 1 (i.e., the side near the gas inflow port 2a), and the electrode 3 can be disposed at the side of the bottom surface of the insulating member 1 (i.e., the side near the gas outflow port 2b), as in the cases of FIGS. 1A, 1B, 2A and 2B. In addition, the electrode 3 may be spaced from the electrode 4 through the insulating (dielectric) material constructing the insulating member 1 in a direction parallel to the flowing direction of the plasma generation gas G in the through hole 2.

Figure 4A:
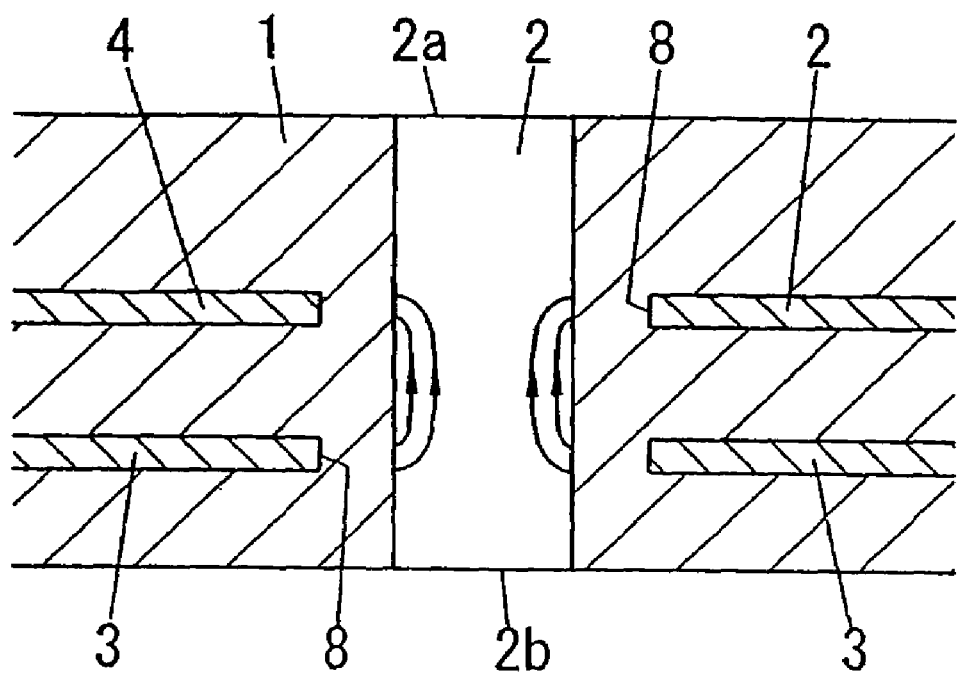
FIG. 4A is a cross-sectional view illustrating a direction of electric flux lines in the case of arranging electrodes in a direction parallel to a flow direction of a plasma generation gas.
Figure 4B:
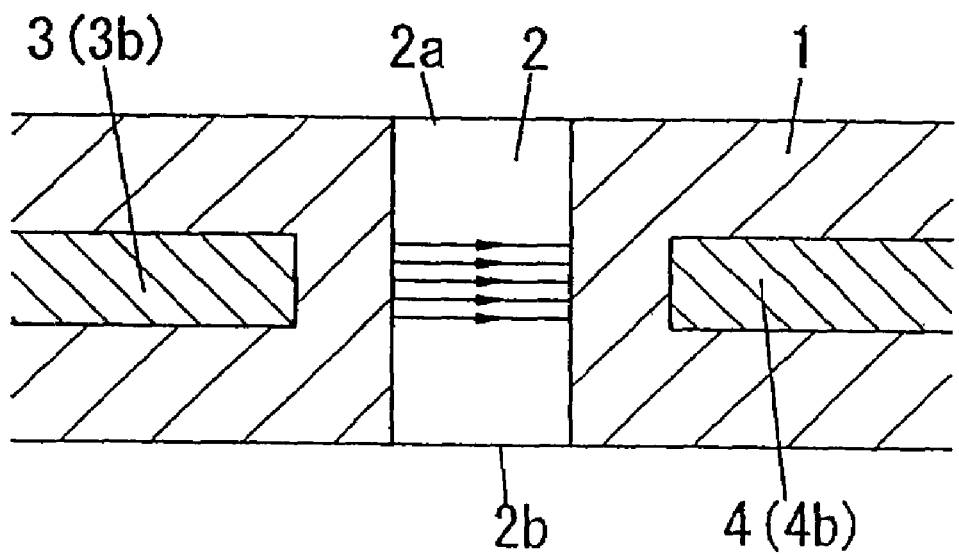
FIG. 4B is a cross-sectional view illustrating a direction of electric flux lines in the case of arranging the electrodes in a direction intersecting with the flow direction of the plasma generation gas.

For example, the electrodes 3, 4 can be successively formed in layers in the insulating member 1 such that apertures are formed at locations corresponding to the through holes 2, and the through holes 2 are positioned in the corresponding apertures of the electrodes 3, 4. In this case, electric flux lines developed in the through hole 2 by a potential difference between the electrodes have the direction parallel to the flowing direction of the plasma generation gas G, as shown in FIG. 4A. In the discharge space of the respective through hole 2, a high-density streamer discharge can be generated. As a result, it is possible to increases the density of activated species generated by the discharge, and improve the efficiency of the plasma surface treatment.

In the reaction vessel R composed of the insulating member 1 and the electrodes 3, 4 formed therein, the electrodes 3, 4 and the through holes 2 can be densely formed with ease. In addition, by forming fine through holes 2, and the electrodes 3, 4 for developing discharges in the fine through holes, the activated plasma generation gas G can be ejected from the through holes 2 arranged in the two dimensional pattern. As a result, an increase in treatment area and a uniformity of the treatment effect can be achieved.

The reaction vessel R having the insulating member 1 and the electrodes 3, 4 can be obtained by mixing a powder of an insulating material with a binder, molding a resultant mixture into a sheet, and laminating an electrically conductive film on the sheet. The sheet can be prepared by mixing a ceramic powder such as quartz glass, alumina, zirconia, mullite, and aluminum nitride with the binder and if necessary various types of additives, and molding the resultant mixture into the sheet shape. A thickness of this sheet can be determined depending on the thickness of the insulating member 1 and the distance between the electrodes 3, 4. For example, it is preferred that the sheet thickness is in a range of 0.05 to 5 mm.

On the other hand, the conductive film can be formed by means of printing an electroconductive metal material such as copper, tungsten, aluminum, brass and a stainless steel on the insulating member. For example, after the conductive film is formed on the sheet, the sheet having the conductive film and the other sheet are laminated such that the conductive film is put between the sheets. The thus obtained laminate is sintered to obtain the insulating member 1. In addition, the through holes 2 can be formed by drilling the laminate. Alternatively, it is preferred that the lamination and the formation of the through holes 2 are simultaneously performed by using the sheets having previously formed through holes 2, and molding the sheets laminated such that positions of the through holes 2 of the sheets correspond to each other.

As shown in FIGS. 1B and 2B, when the electrode 4 is provided at one-surface side (i.e., the upper side having the gas inflow port 2a) of the insulating member 1, and the electrode 3 is provided at the opposite-surface side (i.e., the lower side having the gas outflow port 2b), an electrically conductive film is formed in a desired pattern for the electrode 4 (or 3) on a surface of a first sheet by printing, and then a second sheet is placed on the conductive film. Then, an electrically conductive film is formed in a desired pattern for the electrode 3 (or 4) on a surface of the second sheet by printing. In addition, a third sheet is placed on this conductive film to obtain a laminate.

Alternatively, the laminate may be formed by the following process. That is, a sheet having an electrically conductive film printed in a desired pattern for the electrode 4, sheet having an electrically conductive film printed in a desired pattern for the electrode 3, and sheets each having no electrically conductive film may be laminated such that each of the electrically conductive films is disposed between the sheet materials, and both of outermost layers of the laminate are formed by the sheet materials. The obtained laminate is sintered to obtain the reaction vessel R.

As shown in FIGS. 3A and 3B, when the both of the electrodes 3, 4 are formed at the same level in the insulating member 1, an electrically conductive film is formed in desired patterns for the electrodes 3, 4 on a surface of a first sheet by printing, and then a second sheet is placed on the conductive film to obtain the laminate. Then, the obtained laminate is sintered to obtain the reaction vessel R. The reaction vessel R is disposed in a flow channel of the plasma generation gas G such that the plasma generation gas flows from the gas inflow ports 2a toward the gas outflow ports 2b through the through holes 2.

Figure 8:
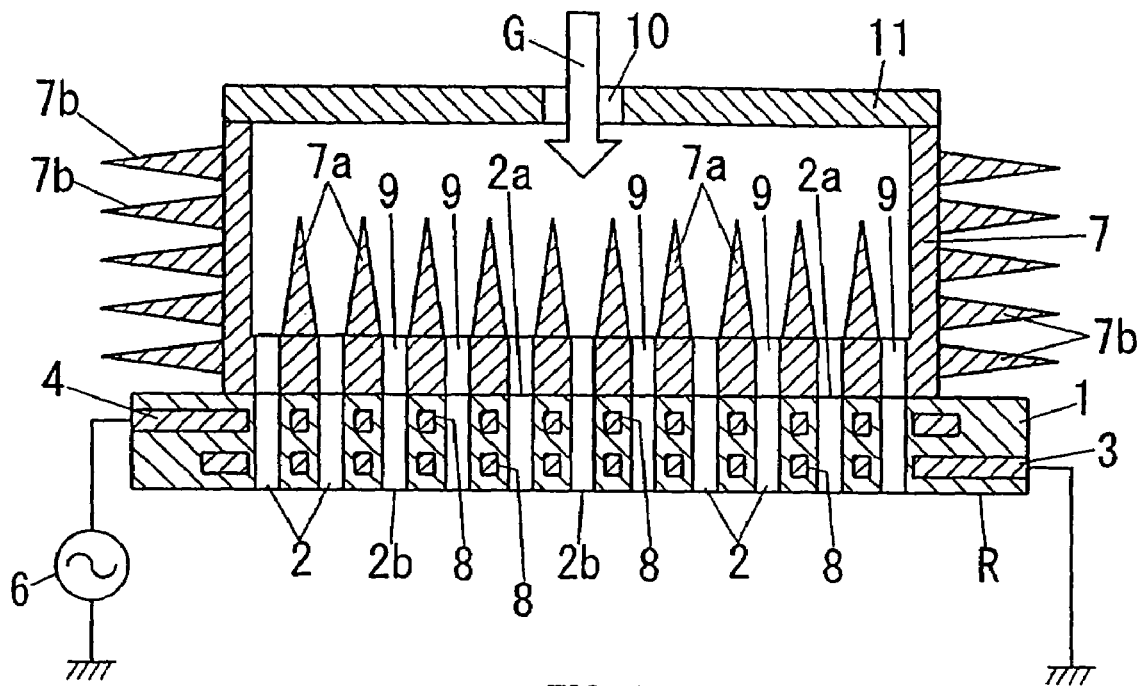
FIG. 8 is a schematic cross-sectional view of a plasma treatment apparatus according to still another preferred embodiment of the present invention.

In FIG. 8, the reaction vessel R shown by FIGS. 2A and 2B is used, and a gas reservoir 11 is provided on the top surface (having the gas inflow ports 2a) of the insulating member 1. The through holes 2 are communicated with the interior of the gas reservoir 11. The gas reservoir 11 is formed with a gas inlet 10 for supplying the plasma generation gas G from its one end (its top end) into the gas reservoir, and a gas outlet 9 for the plasma generation gas formed at its opposite end (its bottom end). The insulating member 1 is disposed under the gas outlet 9 of the gas reservoir 11. In this embodiment, the gas outlet 9 of the gas reservoir 11 is comprised of a plurality of gas outlets 9 at locations corresponding to the through holes 2 of the insulating member 1. As a result, the interior of the gas reservoir 11 is communicated with the through holes 2 through the gas outlets 9.

It is preferred that the gas reservoir 11 has a gas uniforming unit for supplying the plasma generation gas G into the through holes 2 at a substantially uniform flow rate. When the plasma generation gas G flows in the gas reservoir 11 through the gas inlet 10, the pressure is reduced by an increase in volume, so that the plasma generation gas G can flow into all of the through holes 2 at the uniform flow rate. As a result, the activated plasma generation gas G can be uniformly supplied from all of the through holes 2 of the insulating member 1, and a uniform plasma treatment can be performed under an improved flow-rate distribution of the plasma generation gas G.

In addition, it is preferred that the plasma treatment apparatus has a radiator 7 for cooling the insulating member 1. In this case, it is possible to prevent a breakage such as cracks resulting from a thermal deformation of the insulating member 1, and the nonuniformity of the plasma ejected from the through holes 2 when the insulating member 1 is partially overheated, thereby stably maintaining the uniform surface treatment.

For example, the gas reservoir 11 is also allowed to have the function of the radiator 7. In this case, the insulating member 1 is formed to contact the radiator 7. In the embodiment shown by the drawing, the radiator 7 is composed of end partitions having the gas outlets 9 of the gas reservoir 11, and a partition (side partition) integrally formed with the end partitions, which extends between the top and bottom ends of the gas reservoir 11. Heat-radiating fins 7b are formed on an outer surface of the side partition so as to projects outside. On the other hand, heat-absorbing fins 7a are formed at locations not corresponding to the gas outlets 9 on the end partitions so as to project inside the gas reservoir 11.

By the formation of such a radiator 7, heat is absorbed from the plasma generation gas G by the heat-absorbing fins 7a, transmitted to the heat-radiating fins 7b through the end partitions and the side partition, and finally radiated to the outside of the apparatus from the heat-radiating fins 7b. As a result, it is possible to prevent an increase in temperature of the plasma generation gas G and the insulating member 1.

Figure 9:
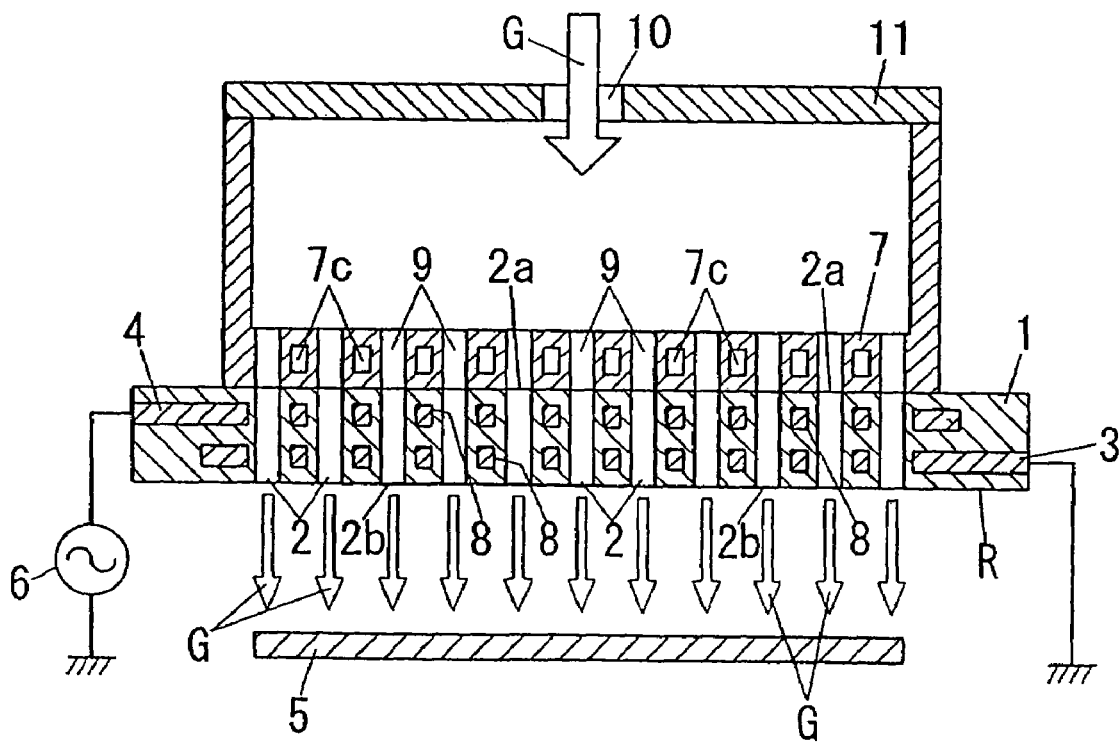
FIG. 9 is a schematic cross-sectional view of a plasma treatment apparatus according to a further preferred embodiment of the present invention.
Figure 10:
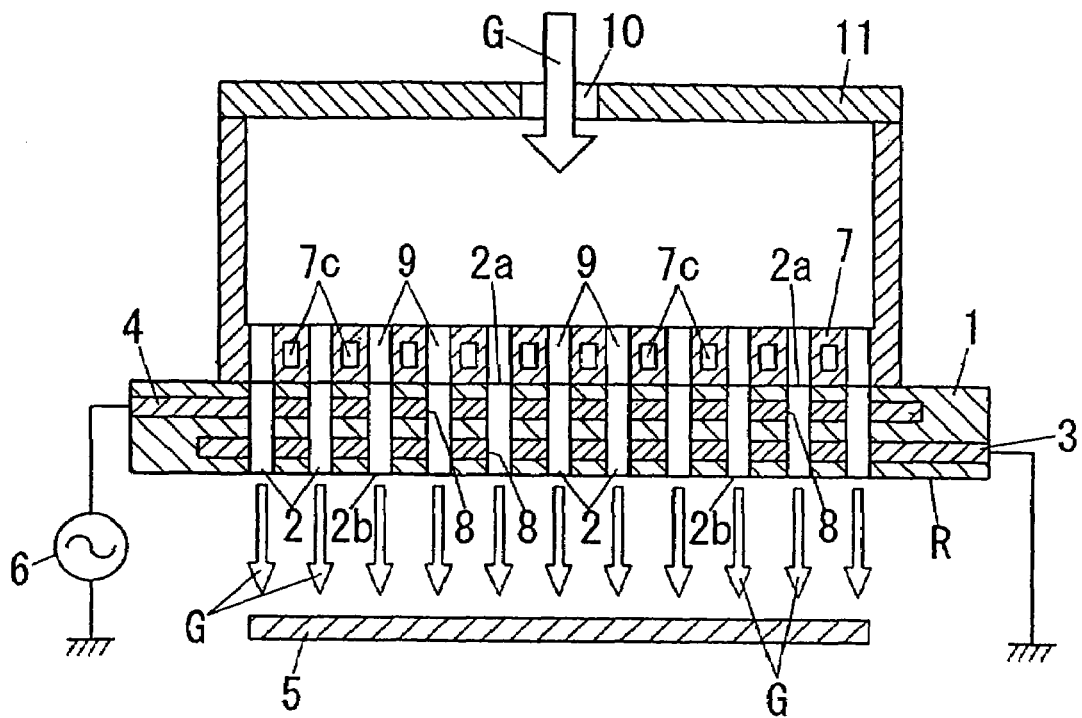
FIG. 10 is a schematic cross-sectional view of a plasma treatment apparatus according to another preferred embodiment of the present invention.

The above radiator 7 is an air cooling type using the heat-radiating fins 7b. Alternatively, an radiator 7 of water-cooling type may be used. In the embodiments shown in FIGS. 9 and 10, a cooling water is allowed to flow in coolant channels 7c, each of which is formed at a location between adjacent gas outlets 9 in the end partitions, to cool the insulating member 1. FIG. 9 shows a case that the radiator 7 is formed on the reaction vessel R shown in FIGS. 2A and 2B. FIG. 10 shows another case that the radiator 7 is formed on the reaction vessel R shown in FIGS. 1A and 1B. In these cases, since the end partitions disposed to contact the insulating member 1 are cooled, it is possible to efficiently cool the insulating member 1 and prevent the increase in temperature of the insulating member 1.

The cooling water can be also used as a temperature regulator for controlling the temperature of the insulating member 1 to a temperature where secondary electrons are easily released. That is, by the influence of electrons and ions included in the activate plasma generation gas G, the secondary electrons can be released from the insulating member 1. As higher the temperature of the insulating member 1, the secondary electrons are easily released. However, in consideration of a damage of the insulating member 1 caused by thermal expansion, it is suitable that the temperature of the insulating member 1 is up to appropriately 100° C.

Therefore, it is preferred to control the temperature of the insulating member 1 within a range of 40 to 100° C. by use of the cooling water. Thus, by use of the cooling water having the temperature higher than room temperature, the surface temperature of the insulating member 1 can be increased at a temperature higher than room temperature at the time of starting the use of the apparatus, so that the secondary electrons can be easily released from the insulating member 1, as compared with the case of starting the use of the apparatus at room temperature. As a result, the plasma generation density can be increased by the secondary electrons released from the insulating member 1 to improve the plasma treatment effects such as the effects of modifying and cleaning the object 5. In view of easiness of handling and energy consumption, it is further preferred that the temperature of the cooling water is within a range of 50 to 80° C.

It is preferred that the gas reservoir 11 and the radiator 7 are made of a material having a high thermal conductivity. For example, it is possible to use copper, stainless steel, aluminum or aluminum nitride (AlN). When the gas reservoir 11 and the radiator 7 are made of an insulating material such as aluminum nitride, it is possible to minimize the influence of a radio-frequency voltage applied between the electrodes, and therefore efficiently develop the discharge, while substantially preventing the loss of electric power applied between the electrodes. In addition, a high cooling efficiency is achieved by the high thermal conductivity.

In addition, when the increase in temperature of the insulating member 1 is controlled by the radiator 7, it is possible to prevent that the insulating member 1 is damaged by a thermal deformation. In addition, when the insulating member 1 is partially overheated, there is a tendency that the plasma generation in the through holes 2 becomes nonuniform as higher the plasma generation density at the overheated portion. By preventing the increase in temperature of the insulating member 1, the nonuniformity of the plasma generation in the through holes 2 can be prevented, so that the surface treatment can be performed uniformly.

In addition, when an electric heater is built in the radiator 7 as the temperature regulator for the insulating member 1, it is possible to obtain the similar effect to the above. In this case, it is preferred that a temperature measuring unit such as thermocouple is disposed in the radiator 7 to monitor the temperature of the radiator 7. Alternatively, a Peltier device may be used as the radiator 7.

It is preferred that the insulating member 1 is connected to the radiator 7 such that a leakage of the plasma generation gas G is prevented without a deterioration of thermal conductivity. For example, they can be bonded by use of a thermal conductive grease, thermal conductive double-faced adhesive tape, or a bonding resin containing material. Alternatively, surfaces of the insulating member 1 and the radiator 7 may be mirror-polished, and then pressure bonded to each other.

In addition, it is preferred that the insulating member 1 and the radiator 7 are integrally formed. In this case, heat can be efficiently adsorbed from the discharge space by the radiator 7. In addition, since the leakage of the plasma generation gas G is prevented, it is possible to obtain a uniform temperature distribution of the insulating member 1, and stabilize the discharges.

To perform the surface treatment to the object 5 with the above-described plasma treatment apparatus, the plasma generation gas G is supplied to the gas reservoir 11 through the gas inlet 10, and then sent to the through holes 2 of the insulating member 1 through the gas outlets 9 and the gas inflow ports 2a. Next, the plasma generation gas G is activated by the discharges developed at the discharge space between the electrodes (3, 4) in the through holes 2, and ejected from the gas outflow ports 2b.

To supply the plasma generation gas G into the through holes 2 of the reaction vessel R through the gas reservoir 11, a gas supply unit (not shown) can be formed, which is composed of, for example, a gas cylinder, gas piping, mixer, and a pressure valve. In this case, gas cylinders each storing a gas component of the plasma generation gas G are connected to the gas reservoir 11 by the gas piping. At this time, the gas components supplied from the gas cylinders are mixed at a required mixture ratio by the mixer, and then a resultant mixture is sent to the gas outlets 9 at a required pressure by the pressure valve.

It is preferred that the gas supply unit supplies a gas containing at least one of a rare gas, nitrogen, oxygen, and air, or a mixed gas of two or more thereof as the plasma generation gas G.

In the case of using the air, a surface modification of the object 5 and a removal of an organic material from the object 5 can be achieved by the plasma treatment. A dried air that hardly contain moisture is preferably used as the air. As the rare gas, it is possible to use helium, argon, neon, or krypton. In view of cost performance and the discharge stability, it is preferred to use argon. The plasma treatment using the rare gas or nitrogen presents the surface modification of the object 5. In addition, the plasma treatment using oxygen presents the removal of the organic material from the objects 5. In addition, the plasma treatment using a mixed gas of the rare gas and oxygen presents the surface modification and the removal of the organic material. The reactive gas such as oxygen and the air may added to the rare gas or nitrogen. The kind of the reactive gas can be determined depending on the purpose of the treatment.

In the case of cleaning an organic material adhered on the object 5, removing a resist, etching an organic film, or surface cleaning an LCD or a glass plate, it is preferred to use an oxidative gas such as oxygen, air, $CO_2$ and $N_2O$. In addition, a fluorine containing gas such as $CF_4$, $SF_6$ and $NF_3$ can be used as the reactive gas. In the case of performing etching or ashing of silicon or the resist, it is effective to use the fluorine containing gas. In the case of reducing a metal oxide, a reducing gas such as hydrogen and ammonia can be used.

The plasma generation gas G can be activated by the discharges developed at the discharge spaces between the electrodes 3, 4 in the through holes 2. When a high voltage is applied between the electrodes 3, 4 by use of the electric power source 6, an electric field is generated in the discharge space. By the generation of the electric field, a gas discharge is obtained in the discharge space at atmospheric pressure or a pressure in the vicinity of atmospheric pressure. The plasma generation gas G is activated by the gas discharge, and allowed to become a plasma in the discharge space where activated species such as radicals and ions are generated.

At this time it is preferred that the plasma generation gas G is supplied to the through holes 2 at a pressure adequate for providing a required flow amount per unit time without receiving the influence of pressure loss. In other words, it is preferred to supply the plasma generation gas G such that the pressure in the gas reservoir 11 is atmospheric pressure or a pressure in the vicinity of atmospheric pressure (preferably 100 to 300 kPa).

The voltage applied between the electrodes 3, 4 by the power source 6 to activate the plasma generation gas G supplied from the gas inflow ports 2a into the through holes 2 can be determined to have an appropriate waveform such as alternating-current waveform, pulse waveform, and a superimposed waveform of them. In particular, it is preferred to use the power source 6, which enables to apply a voltage having a pulse-like waveform with a rest period between the electrodes 3, 4. In this case, it is possible to stably develop a uniform discharge in each of the through holes 2 with a high efficiency, and therefore improve the treatment efficiency. In addition, since the occurrence of a non-discharge area in the through holes 2 is effectively prevented, the uniform discharge can be maintained in each of the through holes. As a reason that the discharge uniformity is maintained, it is believed that even when the discharge accidentally disappear in a part of the through holes 2, the discharge state in each of the through holes is cancelled once in the rest period, and then recovered by applying the voltage therebetween again after the elapse of the rest period.

Figure 11:
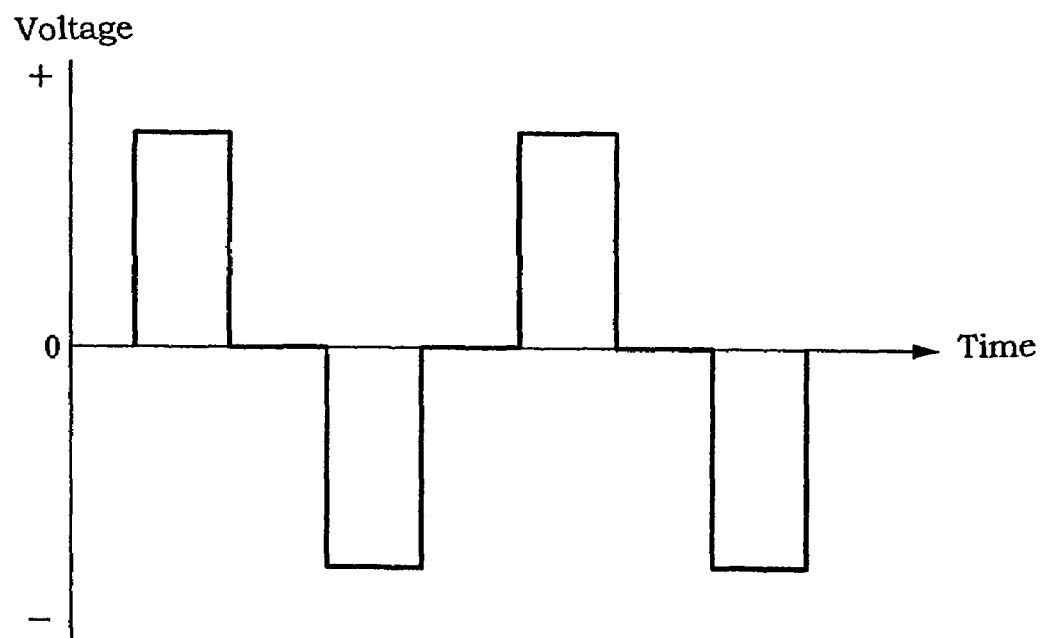
FIG. 11 is a graph showing an example of a voltage waveform applied between the electrodes.
Figure 12:
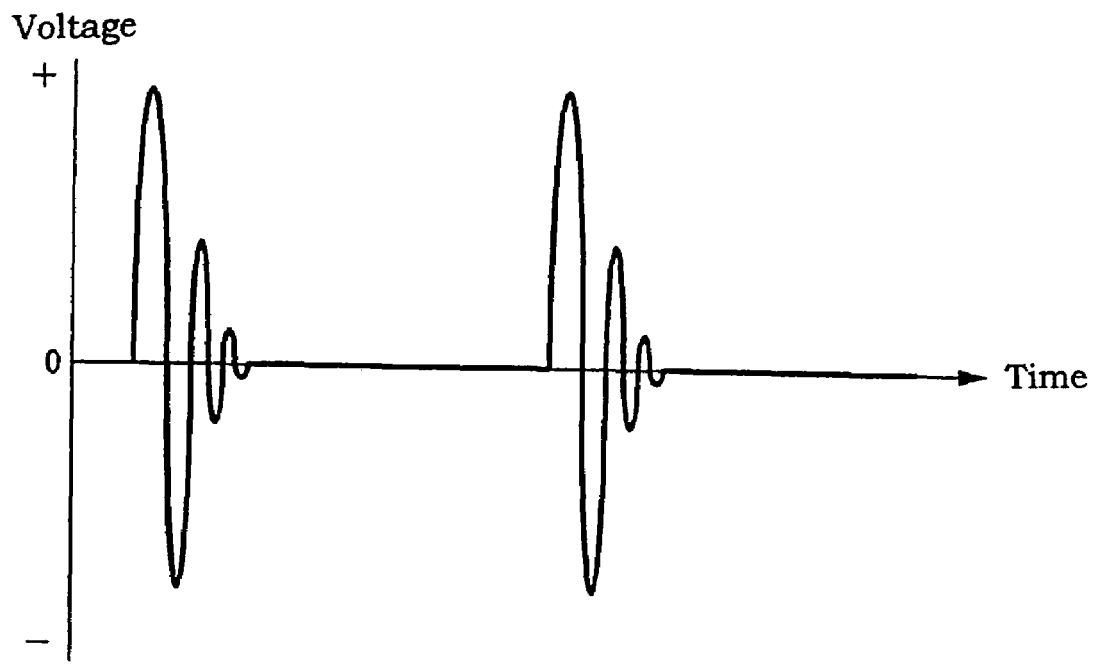
FIG. 12 is a graph showing a further example of a voltage waveform applied between the electrodes.
Figure 13:
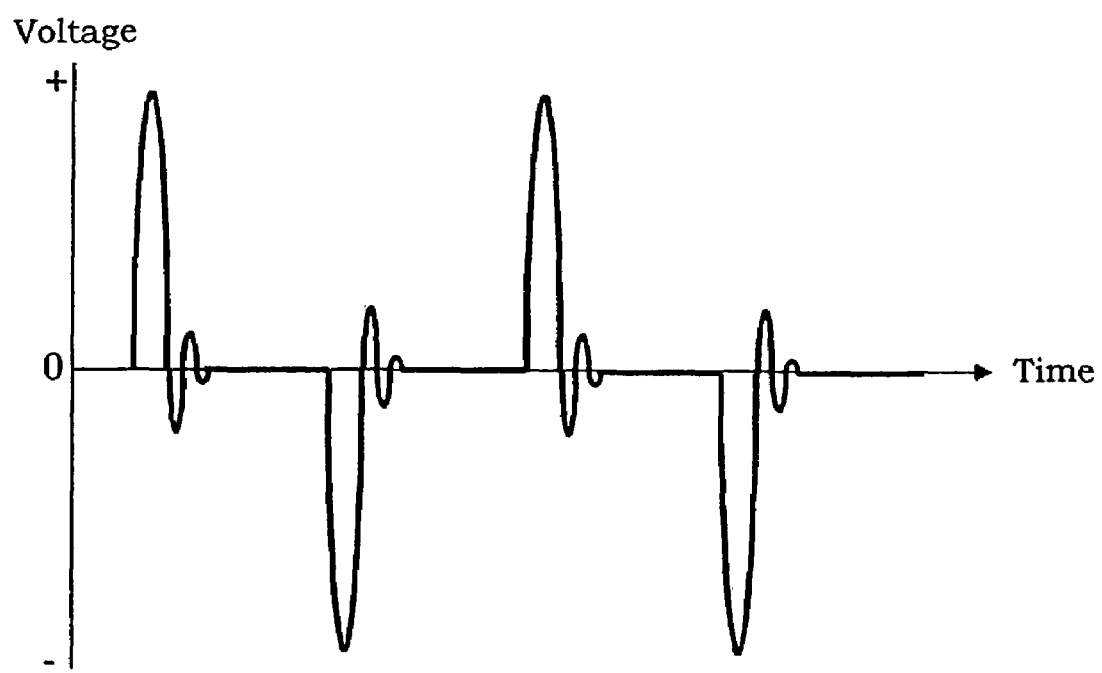
FIG. 13 is a graph showing another example of a voltage waveform applied between the electrodes.

Each of FIGS. 11, 12 and 13 shows a waveform of a pulse-like voltage with a rest period. That is, FIG. 11 shows rectangular wave pulses where the rectangular pulse and the rest period are alternately repeated. FIG. 12 shows oscillatory wave pulses where a set of a rising edge, damping period, and a rest period is repeated at a required cycle. FIG. 13 shows symmetry pulses where a set of a positive pulse voltage output, rest period, negative pulse voltage output, and a rest period in one wavelength is repeated as one cycle, as in the case of the rectangular wave pulses. According to the symmetry pulse waveform of FIG. 13, the discharge state is close to that obtained by using the rectangular wave pulses. In addition, switching can be performed at a relatively low voltage, and a transformer can be used for pressurizing. Therefore, it is possible to simplify the structure of the power source 6, as compared with the case of using the rectangular wave pulses. The voltage applied between the electrodes 3, 4 to continuously develop the gas discharge in the discharge space can be determined depending on the inner diameter of through hole 2 and the distance between the electrodes 3, 4. For example, the voltage can be determined in a range of 0.05 to 30 kV.

In addition, it is preferred to use a pulse-like waveform power source for applying a voltage having a frequency of 1 Hz to 200 kHz between the electrodes 3, 4. When a repetition frequency of the voltage waveform applied between the electrodes 3, 4 is less than 1 Hz, there is a fear that the surface treatment can not be efficiently performed due to a reduction in discharge stability in the discharge space. On the other hand, when the frequency exceeds 200 kHz, it may become difficult to uniformly develop the discharge in the through holes 2 because temperature of the gas discharge (plasma) in the discharge space considerably increases, and the discharge easily concentrates at a part of the through holes 2. In the above range of the frequency, the discharge developed between the electrodes 3, 4 is stabilized to further improve the treatment efficiency. In addition, it is possible to avoid the occurrence of a thermal damage of the object 5 by preventing such an excessive increase in temperature of the plasma generation gas G. Furthermore, the uniform surface treatment can be performed by preventing the concentration of the discharge at the part of the through holes 2.

In addition, as the power source 6, it is preferred to use a pulse-like waveform power source for applying a pulse-like voltage having 0.01 to 80% of a duty ratio of the voltage waveform between electrodes 3, 4. In this case, since a stable discharge is obtained with a high efficiency, the treatment efficiency can be further improved. The duty ratio of the rectangular wave pulses shown in FIG. 11 can be determined by dividing a width between a rising edge and a falling edge of a pulse by a width between the rising edge of the pulse and the rising edge of the next pulse through the rest period. In addition, in the case of using the oscillatory wave pulses shown in FIGS. 12 and 13, the duty ratio can be determined by dividing a width between waveforms of a rising edge of a first pulse and a falling edge of a second pulse by a period including from the rising edge of the first pulse to the oscillation-damping period and the rest period.

In the present invention, it is also preferred that the electrodes 3, 4 are neutral grounded. In this case, an electric potential between the activated plasma generation gas G and the object 5 can be reduced, and the occurrence of arc discharge from the activated plasma generation gas G toward the object 5 can be prevented. In other words, since the voltage is applied under a condition that both of the electrodes 3, 4 are in a floating state relative to the ground, the electric potential between the activated plasma generation gas G (plasma jet) and the object 5 can be decreased. As a result, it is possible to prevent the occurrence of arc discharge, which may cause a thermal damage of the object 5.

Figure 14B:
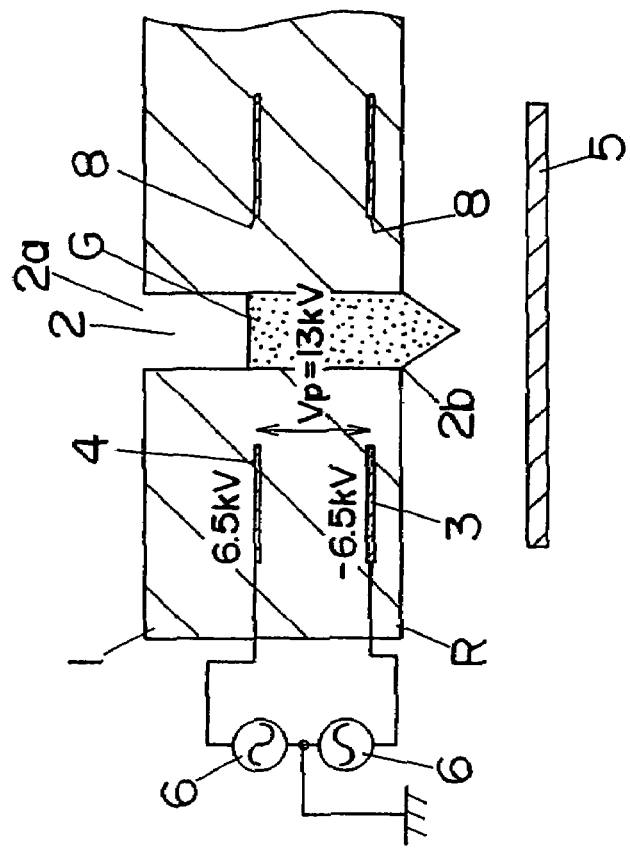
FIGS. 14A and 14B are partially cross-sectional views of a plasma treatment apparatus according to another preferred embodiment of the present invention.
Figure 14A:
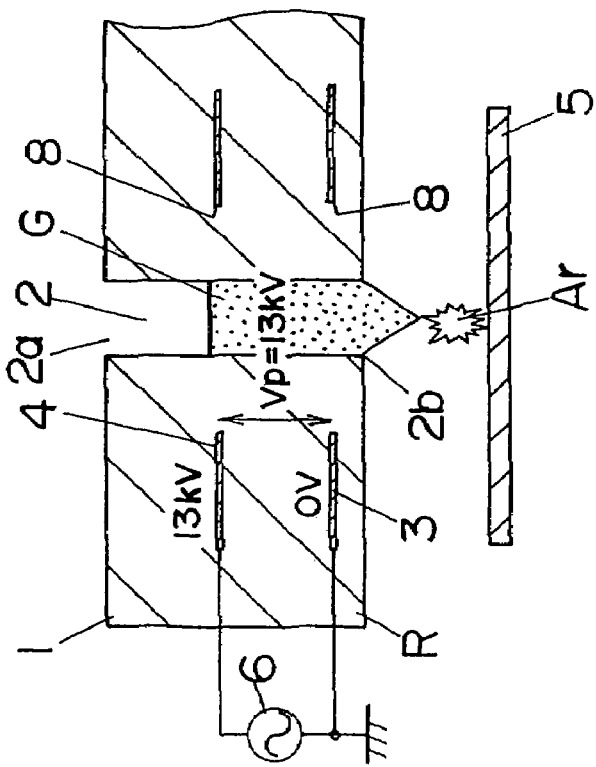

For example, as shown in FIG. 14A, when 13 kV is applied to the upper electrode 4 connected to the power source 6, and the lower electrode 3 is grounded (0 kV), a potential difference of 13 kV is obtained therebetween. In this case, at least several kV of the potential difference occur between the activated plasma generation gas G and the object 5, so that arc discharge Ar may be generated. In the case of using the neutral grounding, when the electric potential of the upper electrode 4 is +6.5 kV, and the electric potential of the lower electrode 3 is −6.5 kV, as shown in FIG. 14B, the potential difference of 13 kV is obtained therebetween. In this case, the potential difference between the activated plasma generation gas G and the object 5 is nearly zero. That is, when using the neutral grounding, it is possible to reduce the potential difference between the activated plasma generation gas G and the object 5 irrespective of the same potential difference between the electrodes 3, 4 as the case of not using the neutral grounding. As a result, the occurrence of the arc discharge from the activated plasma generation gas G toward the object 5 can be prevented.

Subsequently, the plasma generation gas G containing activated species is successively ejected from the gas outflow ports 2b. Therefore, the surface treatment can be performed by spraying the activated plasma generation gas G on at least a part of the object 5 placed below the gas outflow ports 2b.

When the object 5 is placed below the gas outflow ports 2b, it may be conveyed by a conveying unit such as a roller and a belt conveyer. In this case, the surface treatment can be successively performed to a plurality of objects 5, which are being conveyed in order to the position below the gas outflow ports 2b by the conveying unit.

In addition, the distance between the gas outflow ports 2b and the object 5 can be appropriately determined depending on flow rate of the plasma generation gas G, kind of the plasma generation gas G, kind of the object 5, and the purpose of the surface treatment. For example, the distance can be determined in a range of 1 to 30 mm.

In the surface treatment described above, the gas discharge is generated in each of the through holes 2, and the plasma generation gas G activated by the gas discharge is sprayed on the object 5 through the through holes 2. Therefore, large-area, uniform plasma is obtained with a high efficiency, and therefore a large-area surface treatment can be uniformly performed to the object 5 with a reduced gas flow amount.

Thus, according to the present invention, the treatment area to be treated at a time can be increased. This improves the treatment efficiency. In addition, when the surface treatment is performed to the objects 5, which are being conveyed, the objects 5 can be exposed to the activated plasma generation gas G for an extended time period. Therefore, the surface treatment can be effectively carried out with the reduced gas flow amount. In other words, the surface treatment capability can be improved by prolonging the contact time between the activated species and the object 5 without increasing the gas flow amount. As a result, an increase in running cost of the surface treatment apparatus can be prevented to provide a good cost performance.

In the above embodiments, a rectangular treatment area is obtained by use of the insulating member 1 having the rectangular shape in plan view. The treatment area can be appropriately changed depending on the object 5. For example, by changing size and shape of the insulating member 1, or modifying the arrangement of the through holes 2, a desired treatment area can be obtained.

In addition, a reaction vessel R may be formed by combining a plurality of insulating members 1 to further increase the treatment area. In addition, the insulating members 1 may be arranged in a desired pattern to perform the surface treatment only to a specific region of the object 5. Moreover, when the insulating members 1 having different distances with the object 5 are disposed, it is possible to simultaneously treat both of an area where a hard surface treatment is needed and an area where a soft surface treatment is needed of the object 5. Therefore, these function as treatment-effect adjusting means.

Figure 15A:
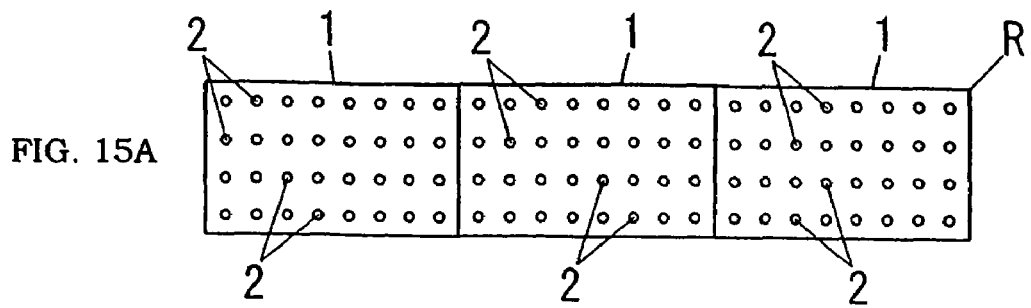
FIGS. 15A to 15D are plan and side views of reaction vessels formed by combining a plurality of insulating members.
Figure 15B:
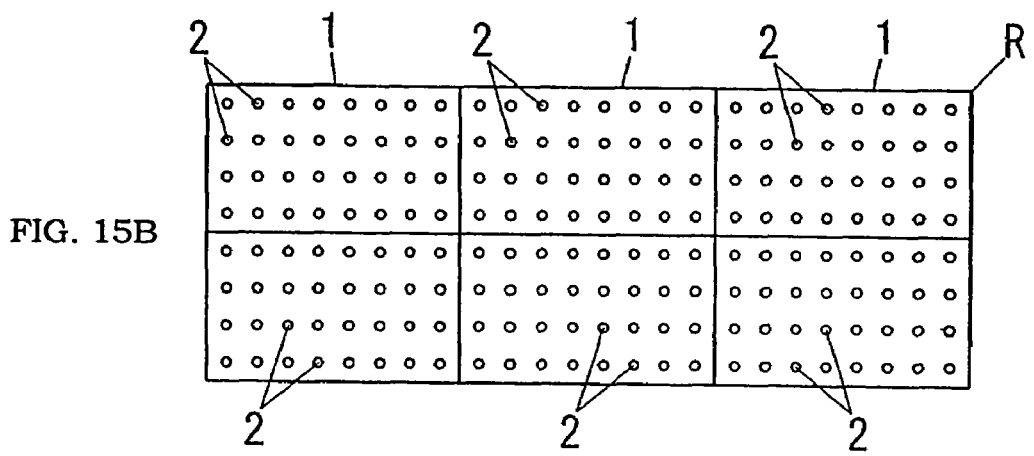
Figure 15C:
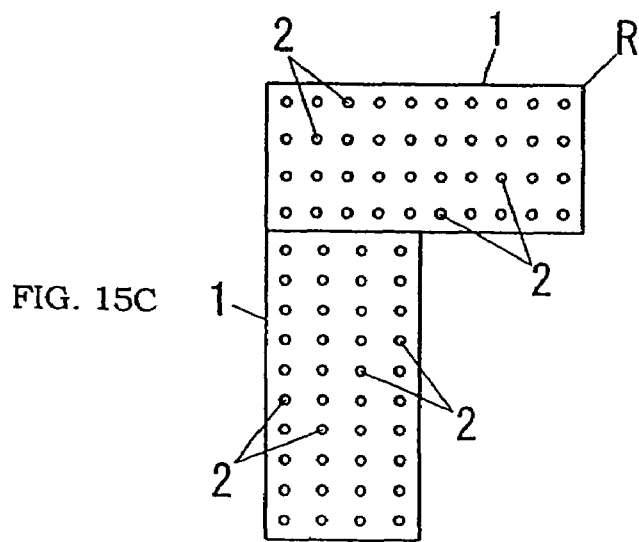
Figure 15D:
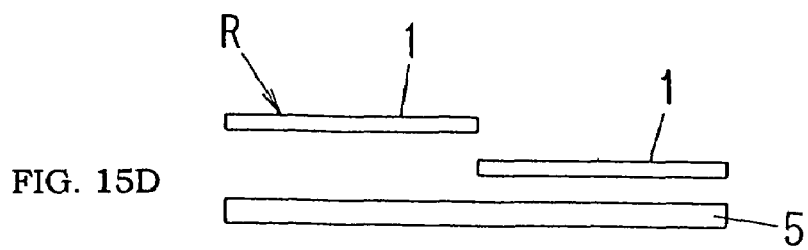

For example, as shown in FIG. 15A, the reaction vessel R can be formed by aligning a plurality of insulating members 1. Alternatively, as shown in FIG. 15B, the reaction vessel R can be formed by arranging the insulating members 1 in a matrix pattern. In these cases, a further increase in treatment area can be achieved. In addition, when the insulating members 1 are arranged in desired pattern, the surface treatment can be performed to a treatment region corresponding to the arrangement of the insulating members 1. In this case, the surface treatment can be performed to only a specific region of the object 5. For example, as shown in FIG. 15C, when the insulating members 1 are arranged in an L-shaped pattern to form the reaction vessel R, the surface treatment can be performed to an L-shaped region of the object 5. Furthermore, as shown in FIG. 15D, the reaction vessel R may be formed by arranging the insulating members 1 such that a distance between one of the insulating members and the object 5 is different from the distance between the other insulating member and the object 5. In this case, a relatively lower treatment effect is obtained at the treatment area of the object 5 spaced from the insulating member 1 by a greater distance, as compared with the other treatment area. On the contrary, a relatively higher treatment effect is obtained at the treatment area of the object 5 spaced from the insulating member 1 by a smaller distance, as compared with the other treatment area. Thus, depending on the object 5 to be treated, it is possible to intentionally form the treatment area for providing a high treatment effect and the treatment area for providing a low treatment effect.

In addition, when the reaction vessel R is formed by combining the plurality of insulating members 1, various modifications such as changing the size and the shape of treatment area, or controlling the treatment level can be easily performed by simply changing the number of the insulating members 1 or the arrangement thereof.

In the case of combining the insulating members 1, the radiator 7 and the gas reservoir 11 may be formed in each of the insulating members 1. Alternatively, a single pair of the radiator 7 and the gas reservoir 11 may be formed to simultaneously supply the plasma generation gas G to the insulating members 1 or simultaneously radiate heat from the insulating members 1.

Figure 16A:
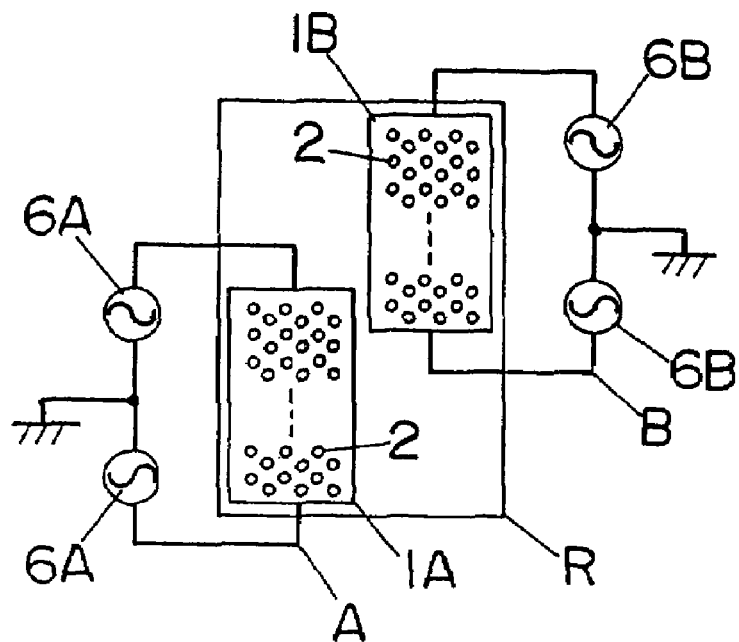
FIG. 16A is a schematic circuit diagram of a plasma treatment apparatus according to a preferred embodiment of the present invention.
Figure 16B:
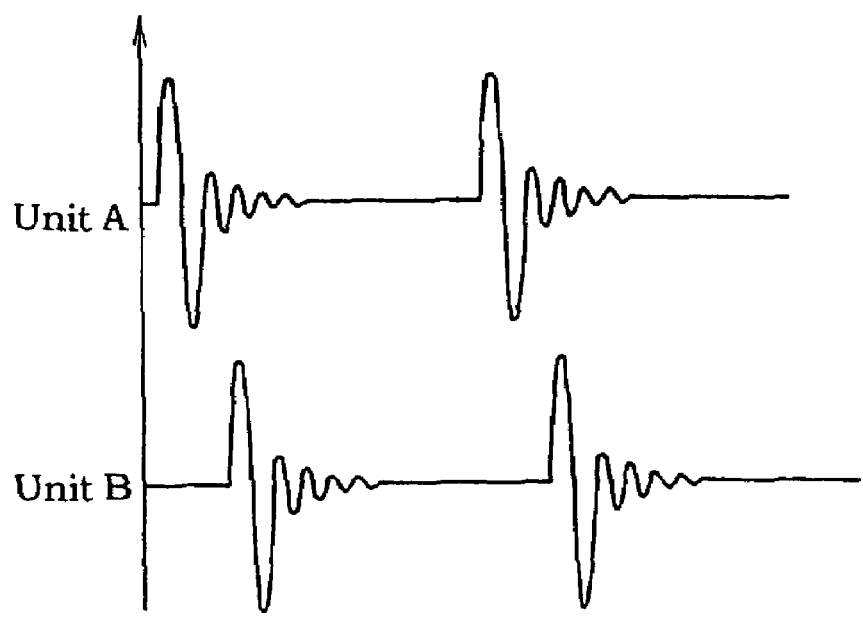
FIG. 16B is a graph showing voltage waveforms applied to units A and B.

In the case of forming the reaction vessel R by combining the insulating members 1, it is preferred to supply electric power to the insulating members 1 from the same electric power source 6. For example, as shown in FIG. 16A, when the reaction vessel R is formed with a unit A comprising a single insulating member 1A and an electric power source 6A, and a unit B comprising a single insulating member 1B and an electric power source 6B, a high-frequency voltage is applied between the electrodes 3, 4 of the insulating member 1A of the unit A by use of the power source 6A, and a high-frequency voltage is applied between the electrodes 3, 4 of the insulating member 1B of the unit B by use of the power source 6B. However, it is difficult to synchronize between the high-frequency voltage generated by the power source 6A of the unit A and the high-frequency voltage generated by the power source 6B of the unit B. For example, as shown in FIG. 16B, a phase displacement often occurs. As a result, there is a fear that the voltage having a desired waveform can not be supplied due to an interference between the voltages generated by the power sources 6A and 6B.

Figure 17:
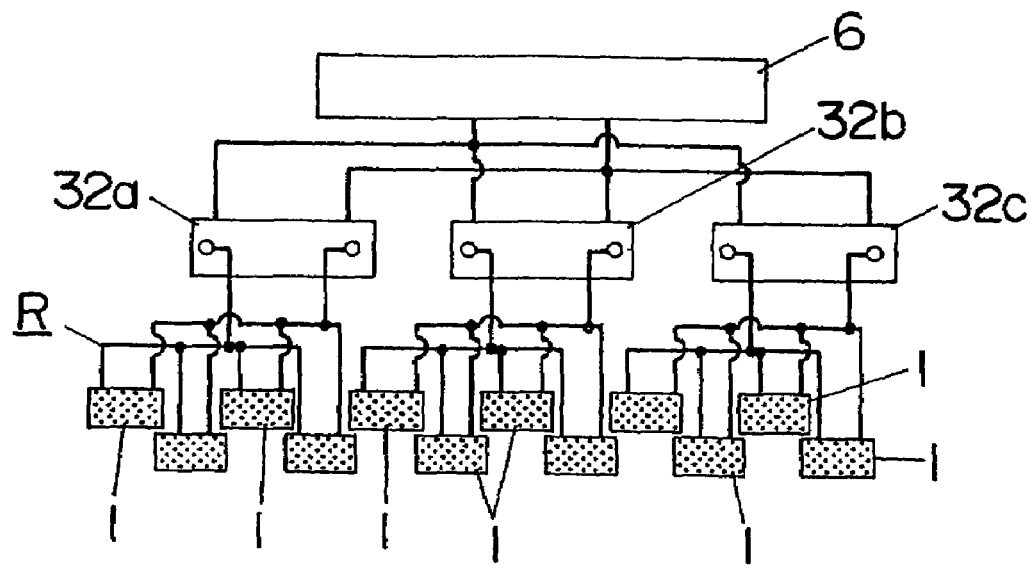
FIG. 17 is a schematic circuit diagram of a plasma treatment apparatus according to a further preferred embodiment of the present invention.

In the present invention, as shown in FIG. 17, it is preferred to supply the electric power to the insulating members 1 from the same power source 6 such as a high-frequency power source. In FIG. 17, a plurality of transformers 32a, 32b, 32c are electrically connected in parallel to the single power source 6, and a plurality of insulating members 1 are electrically connected in parallel to each of the transformers 32a, 32b, 32c. According to this reaction vessel R, it is possible to prevent the occurrence of a phase displacement between the voltages applied to the insulating members 1. That is, it is possible to prevent the interference between the voltages applied to the insulating members 1, and therefore supply the voltage having the desired waveform.

In the present invention, when the plurality pairs of electrodes 3, 4 are arranged in the direction parallel to the flowing direction of the plasma generation gas G in the through holes 2, a high-density streamer discharge can be generated in the discharge space. In this case, it is possible to improve the surface-treatment capability by increasing the density of activated species in the gas without increasing the electric power applied to generate the discharge. In addition, since the surface-treatment capability can be improved without prolonging a supply time of the gas flow of the activated plasma generation gas G to the object 5, it is possible to prevent an extension of treatment time needed to treat the object 5. As a result, there is an advantage that a reduction in productivity does not happen.

In addition, since the density of activated species in the plasma generation gas G sprayed on the object 5 is increased to improve the surface-treatment capability, it is not needed to shorten the distance between the object 5 and the gas outflow ports 2b. Consequently, the occurrence of arc discharge from the discharge space toward the object 5 is minimized to prevent that the object is damaged by the arc discharge. In addition, it is not needed to place a metal mesh between the gas outflow ports 2b and the object to prevent the arc discharge. Therefore, the gas flow of the plasma generation gas G is not obstructed by the presence of the metal mesh, so that the surface treatment capability can be stably maintained. Furthermore, it is possible to eliminate a problem that an oxide (rust) results from corrosion of a metal material of the electrodes 3, 4, and contaminates the object 5.

The present invention is available to surface treatments of various kinds of objects. In particular, the surface treatment is suitable to glass materials for various kinds of flat panel display such as glass materials for liquid crystal, plasma display and organic electro luminescent display, printed wiring boards, or various kinds of resin films such as a polyimide film. In the case of performing the surface treatment to these objects 5, there are advantages of cleaning an foreign substance such as an organic material, removing or etching a resist, improving adhesion of an organic film, reducing a metal oxide, forming a film, pretreatment before water cleaning, plating or coating, and other surface modifications. With respect to the glass materials for flat panel display such as the glass material for liquid crystal, since the treatment area to be treated continues to increase, a larger-area, uniform treatment is needed. Therefore, the plasma treatment apparatus and the plasma treatment method of the present invention are expected to preferably used in these applications because a desired treatment area can be flexibly designed.

In the case of performing the surface treatment to a glass material, the surface treatment can be performed to the glass material having a transparent electrode made of indium tin oxide (ITO), TFT (Thin Film Transistor) liquid crystal, or a color filter (CF). In the case of performing the surface treatment to a resin film, the surface treatment may be successively performed to the resin film being conveyed in a roll-to-roll manner.

EXAMPLES

The present invention is concretely explained according to Examples.

Example 1

An electrically conductive film was formed on a surface of a first sheet (thickness: 0.4 mm) by printing, and then a second sheet (thickness: 1.4 mm) was placed on this electrically conductive film. In addition, an electrically conductive film was formed on a surface of the second sheet by printing, and then a third sheet (thickness: 1.4 mm) was placed on this electrically conductive film. In this embodiment, each of the first to third sheets was obtained by molding a material containing an alumina powder into a sheet shape. Each of the sheets has a plurality of apertures each having a diameter of 1 mm. These sheets were disposed in layers such that positions of the apertures of the respective sheets corresponds to each other. The electrically conductive film was formed by printing a tungsten layer. A plurality of apertures 8 each having a diameter of 3 mm larger than the aperture of the sheets were formed in the electrically conductive film such that each of the apertures of the sheets is disposed in each of the apertures of the electrically conductive film. The thus obtained laminate was sintered to obtain a reaction vessel R, as shown by the plan view of FIG. 2A and the cross-sectional view of FIG. 2B.

In this embodiment, an insulting member 1 of the reaction vessel has a thickness of 3.2 mm, and 55 through holes 2 each having the diameter of 1 mm. These 55 through holes 2 were arranged in a planar region of 45×22 mm such that an interval between adjacent through holes 2 is 4.5 mm. In addition, electrodes 3, 4 are formed by upper and lower tungsten conductive layers each having a thickness of 30 μm, and disposed such that each of the through holes 2 is positioned in each of the apertures 8 of the electrodes 3, 4. A distance between the upper and lower electrodes 3, 4 (i.e., between discharge planes) is 1.4 mm. The electrodes (3, 4) having the apertures 8 are not exposed to the interiors of the through holes 2. An insulating coating having a thickness of 1 mm was formed on inner surfaces of the apertures 8 of the electrodes 3, 4 by use of the same insulating material (dielectric material) as the insulating member 1. The upper electrode 4 was connected to an electric power source 6, and the lower electrode 3 was grounded.

As shown in FIG. 9, a gas reservoir 11 having a copper radiator 7 was placed on the top of the insulating member 1. A plasma generation gas G was introduced from a gas inlet 10 formed in an upper portion of the gas reservoir 11, and is allowed to flow into the through holes 2 of the insulating member 1. A cooling water is circulated in flow channels 7c formed in the radiator 7 to prevent overheating of the insulating member 1.

Example 2

An electrically conductive film was formed on a surface of a first sheet (thickness: 0.7 mm) by printing, and then a second sheet (thickness: 1.5 mm) was placed on the electrically conductive film. Each of the first and second sheets was formed by molding the material containing alumina into a sheet shape, as in the case of Example 1. Each of the first and second sheets has a plurality of slit-like apertures each having a width of 1 mm and a length of 22 mm in a plan view thereof. These sheets were disposed in layers such that positions of the slit-like apertures of the respective sheets corresponds to each other. The electrically conductive film was formed by printing a tungsten layer, as in the case of Example 1. In this embodiment, each of the electrically conductive films was formed in a comb-shaped pattern. The thus obtained laminate was sintered to obtain a reaction vessel R having a structure shown in FIGS. 3A and 3B.

In this embodiment, an insulting member 1 of the reaction vessel has a thickness of 2.2 mm, and 11 slit-like through holes 2 each having the width of 1 mm and the length of 22 mm. These 11 through holes were arranged in a planar region of 45×22 mm such that an interval between adjacent through holes 2 is 3.5 mm. In addition, electrodes 3, 4 were formed on a same plane in the insulating member 1 over a thickness of 100 μm such that the electrode 4 is positioned at one side of each of the through holes 2, and the electrode 3 is positioned at the opposite side of each of the through holes. A distance between the electrodes 3, 4 (i.e., between discharge planes) is 2 mm. In this embodiment, the electrodes 3, 4 are not exposed to the interiors of the through holes 2. An insulating coating having a thickness of 0.5 mm was formed on side surfaces of the electrodes 3, 4 so as to be flush with the inner surface of the through holes 2 by use of the same insulating material (dielectric material) as the insulating member 1. The electrode 4 was connected to an electric power source 6, and the electrode 3 was grounded.

As shown in FIGS. 3A and 3B, a gas reservoir 11 having a radiator 7 made of aluminum nitride was disposed on a top of the insulating member 1. A plasma generation gas G was introduced from a gas inlet 10 formed in an upper portion of the gas reservoir 11, and is allowed to flow into the through holes 2 of the insulating member 1. A cooling water is circulated in flow channels 7c formed in the radiator 7 to prevent overheating of the insulating member 1.

Example 3

A plasma treatment apparatus used in this embodiment is substantially the same as the apparatus of Example 1 except that the diameters of the apertures 8 of the electrodes 3, 4 and the through holes 2 are 1 mm, and inner surfaces of the apertures 8 of the electrodes 3, 4 are exposed to the interiors of the through holes 2, as shown in FIG. 10.

Comparative Example 1

Figure 18:
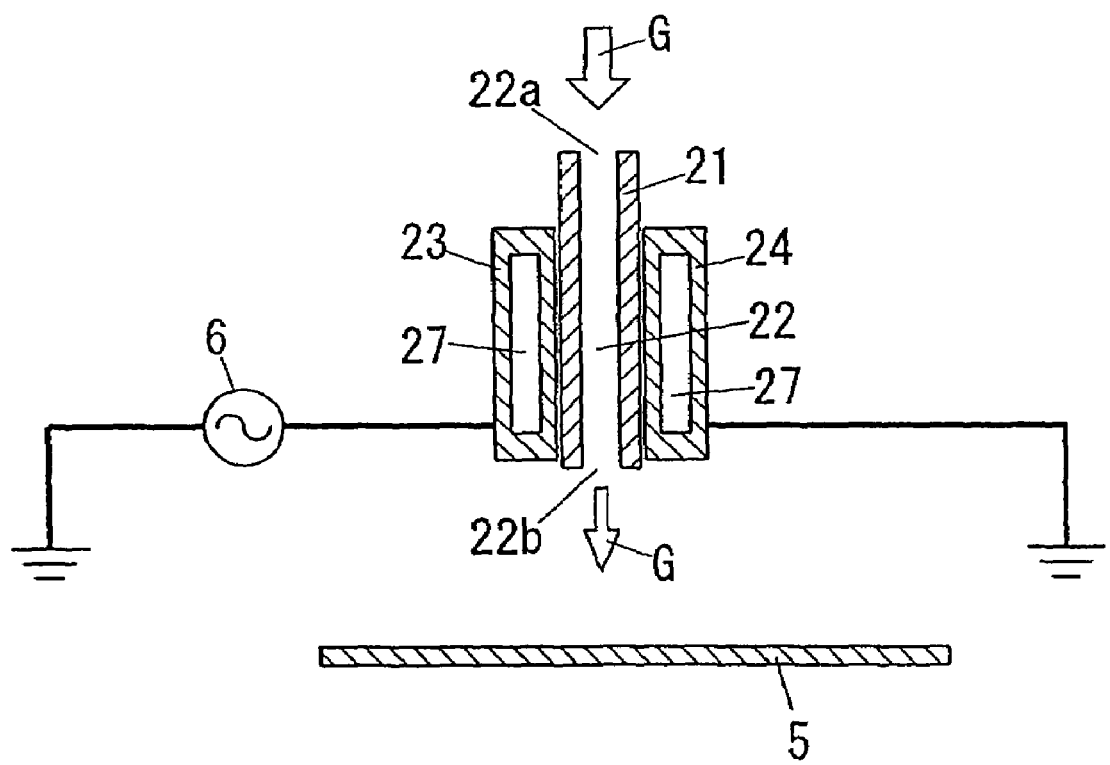
FIG. 18 is a schematic view of a plasma treatment apparatus used in Comparative Example 1.

A plasma treatment apparatus having a cross section shown in FIG. 18 was used. A reaction vessel 21 of this apparatus is configured in a rectangular tubular shape, and made of a quartz glass having a thickness of 1 mm. A discharge slit width defined as an inner (width) size of a discharge generating portion 22 provided in the reaction vessel 21 is 1 mm, which is equal to slit widths of a gas inflow port 22a and a gas outflow port 22b formed at opposite ends of the reaction vessel 21. In addition, the length size of the reaction vessel 21 is 45 mm. Bottom ends of electrodes 23, 24 are located at an upstream side than the gas outflow port 22b by 5 mm.

The pair of electrodes 23, 24 are made of copper, and gold plating was formed thereon. The electrodes 23, 24 are disposed such that the reaction vessel 21 is put therebetween. A cooling water is circulated in flow channels 27 formed in the electrodes 23, 24 to cool the electrodes. The left-side electrode 23 was connected to an electric power source 6, and the right-side electrode 24 was grounded.

(Evaluation 1)

By using each of the plasma treatment apparatuses explained above, a surface treatment was carried out by applying a voltage (6 kHz, 13 kV, 50% of duty ratio) having a pulse-like waveform with a rest period shown in FIG. 11 between the electrodes 3, 4 (23, 24) by use of the electric power source 6, while introducing the plasma generation gas G of 10 liter/minute of nitrogen and 0.02 liter/minute of oxygen under the atmospheric pressure into the reaction vessel, and spraying a gas flow of the plasma generation gas containing activated species on an object being conveyed at a speed of 100 mm/s. As the object, a rare glass for liquid crystal was used. The distance between the object and the gas outflow port 2b (22b) is 5 mm. A contact angle of water of the rare glass measured before the surface treatment is 68 degrees.

With respect to each of Examples 1 to 3 and Comparative Example 1, the contact angle of water of the object 5 was measured after the surface treatment. Results are shown in Table 1. As shown in Table 1, a sufficient reduction in contact angle of water was observed in Examples 1 and 2. In particular, the contact angle of water was remarkably reduced in Example 1. On the contrary, the contact angle of water hardly changed in Comparative Example 1. Thus, these results show that Examples 1 and 2 can provide a higher surface treatment effect than Comparative Example 1.

TABLE 1

|  | Contact Angle of Water |
|---|---|
| Example 1 | 8.3° |
| Example 2 | 9.8° |
| Comparative Example 1 | 65.0° |

(Evaluation 2)

With respect to each of Examples 1, 2 and Comparative Example 1, a surface treatment was performed to the object 5 under the same conditions as the evaluation 1 except for applying a voltage (6 kHz, 13 kV, 5% of duty ratio) having a pulse-like waveform with a rest period shown in FIG. 12 between the electrodes 3, 4 (23, 24). In this evaluation, the surface treatment was repeated until the contact angle of water on the object 5 becomes 10 degrees or less.

The number of times of the surface treatment repeated until the contact angle of water on the object 5 becomes 10 degrees or less is shown in Table 2. As shown in Table 2, the contact angle of water became smaller than 10 degrees by performing the surface treatment once in Examples 1 and 2. On the other hand, in Comparative Example 1, the surface treatment was repeated 7 times to obtain the contact angle of water smaller than 10 degrees. These results show that Examples 1 and 2 can provide a higher treatment efficiency than Comparative Example 1.

TABLE 2

|  | Number of Times of Treatment |
|---|---|
| Example 1 | 1 |
| Example 2 | 1 |
| Comparative Example 1 | 7 |

(Evaluation 3)

With respect to Example 3, a surface treatment was carried out by applying a voltage (6 kHz, 50% of duty ratio) having a pulse-like waveform with a rest period shown in FIG. 11 between the electrodes 3, 4 by use of the electric power source 6, while introducing the plasma generation gas G of 10 liter/minute of nitrogen and 0.02 liter/minute of oxygen under the atmospheric pressure into the reaction vessel, and spraying a gas flow of the plasma generation gas containing activated species on an object being conveyed at a speed of 100 mm/s. In this evaluation, the surface treatment was performed with respect to each of the applied voltages of 8 kV, 9 kV and 10 kV. As the object 5, a rare glass for liquid crystal was used. The distance between the object 5 and the gas outflow port 2b is 5 mm. A contact angle of water on the rare glass measured before the surface treatment is 68 degrees.

The contact angle of water on the object 5 measured after each of the surface treatments is shown in Table 3. As shown in Table 3, a sufficient reduction in contact angle of water was observed in Example 3. Thus, Example 3 can provide a high treatment efficiency. In addition, by increasing the applied voltage, it is possible to further reduce the contact angle of water. However, when the applied voltage is 10 kV, the discharge became unstable, and was not suitable for the surface treatment.

TABLE 3

| Applied Voltage | Contact Angle of Water |
|---|---|
| 8 kV | 22.5° |
| 9 kV | 15.3° |
| 10 kV | Unstable Discharge |

(Evaluation 4)

With respect to Example 1, a surface treatment was carried out by applying a voltage (12 kHz, 30% of duty ratio) having a pulse-like waveform with a rest period shown in FIG. 13 between the electrodes 3, 4 by use of neutral grounding power sources 6A, 6B, while introducing the plasma generation gas G of 10 liter/minute of nitrogen and 0.1 liter/minute of a dried air under the atmospheric pressure into the reaction vessel, and spraying a gas flow of the plasma generation gas G containing activated species on an object being conveyed at a speed of 50 mm/s. As the object 5, a resin film for printed circuit boards was used. The distance between the object 5 and the gas outflow port 2b is 5 mm.

After the plasma treatment, a plating was performed on the treated surface of the object 5, and the adhesion strength was measured. Results are shown in Table 4. As shown in Table 4, the plasma treatment using the apparatus of Example 1 provides effects of remarkably increasing the adhesion strength of the plating film on the object 5, raising the surface-treatment efficiency, and improving the reliability of the plating film.

TABLE 4

|  | Adhesion Strength |
|---|---|
| No Treatment | 0.006 N/mm$^2$ |
| Example 1 | 0.070 N/mm$^2$ |

INDUSTRIAL APPLICABILITY

As described above, according to the plasma treatment apparatus of the present invention, a gas discharge is developed in each of the through holes, and a gas flow of an activated plasma generation gas containing activated species generated by this gas discharge is supplied from the through holes to the object. Therefore, it is possible to efficiently perform a uniform plasma surface treatment to a large area of the object to be treated with a small gas flow amount.

In the case of performing the surface treatment, while conveying the objects, it is possible to expose the objects to the gas flow of the activated plasma generation gas for an extended time period, and efficiently perform the surface treatment with use of the small gas amount. Thus, by prolonging the contacting time of the objects with the activated species without increasing the gas flow amount, it is possible to improve the surface-treatment efficiency, and prevent an increase in running cost of the surface treatment apparatus.

Moreover, the reaction vessel can be easily formed by a combination of a plurality of insulating members, and the level of freedom in designing the apparatus can be increased by changing the arrangement and the number of the insulating members. Therefore, it is possible to provide a suitable plasma treatment apparatus depending on shape and size of the object.

Thus, the plasma treatment apparatus of the present invention, which has the capability of efficiently performing a large-area, uniform plasma treatment, is expected to be used in various applications because the surface treatment can be appropriately performed to an object having a larger area to be treated such as glass for liquid crystal panel in addition to the conventional objects.

The invention claimed is:

1. A plasma treatment apparatus comprising:
a pair of parallel electrode plates having a plurality of through holes;
an insulating member having a plurality of through holes, which is disposed between said electrode plates such that positions of the through holes of said electrode plates correspond to the positions of the through holes of said insulating member;
gas supply means configured to supply a plasma generation gas into a plurality of discharge spaces formed by the through holes of said electrode plates and the through holes of said insulating member; and
voltage applying means configured to apply a voltage between said electrode plates to generate plasmas of the plasma generation gas simultaneously in said discharge spaces, wherein each of the corresponding through holes in said electrode plates and insulating member are coaxial, and wherein said electrode plates are embedded in said insulating member.

2. The plasma treatment apparatus as set forth in claim 1, wherein said insulating member is configured in the form of a plate.

3. The plasma treatment apparatus as set forth in claim 1, wherein said electrode plates are exposed to the interiors of said through holes of said insulating member.

4. The plasma treatment apparatus as set forth in claim 1, wherein said electrode plates are not exposed to the interiors of said through holes of said insulating member.

5. The plasma treatment apparatus as set forth in claim 1, wherein said electrode plates are disposed such that electric flux lines are generated in said through holes in a direction parallel to a flow direction of the plasma generation gas.

6. The plasma treatment apparatus as set forth in claim 1, wherein an interval between said electrode plates is in a range of 0.01 to 5 mm.

7. The plasma treatment apparatus as set forth in claim 1, wherein the openings of said through holes are formed in a circular shape with a diameter of 0.01 to 15 mm.

8. The plasma treatment apparatus as set forth in claim 1, wherein the openings of said through holes are formed in a slit shape with a short-side dimension of 0.01 to 15 mm.

9. The plasma treatment apparatus as set forth in claim 1, wherein said electrode plates are formed in layers in said insulating member, and there is no deficit portion between adjacent apertures in each of said electrode plates.

10. The plasma treatment apparatus as set forth in claim 1, wherein an outer peripheral portion of one of said electrode plates located at a downstream side in a gas-flow direction projects outward relative to the outer peripheral portion of the other electrode plate located at an upstream side in the gas-flow direction.

11. The plasma treatment apparatus as set forth in claim 1, wherein said insulating member is made of a ceramic.

12. The plasma treatment apparatus as set forth in claim 1, wherein said insulating member is made of alumina.

13. The plasma treatment apparatus as set forth in claim 1, comprising an electric power source for applying a pulse-like voltage with a rest period between said electrode plates.

14. The plasma treatment apparatus as set forth in claim 1, comprising an electric power source for applying a voltage with a frequency of 1 Hz to 200 kHz between said electrode plates.

15. The plasma treatment apparatus as set forth in claim 1, comprising an electric power source for applying a pulse-like voltage with a duty ratio of 0.01 to 80% between said electrode plates.

16. The plasma treatment apparatus as set forth in claim 1, wherein said gas supply means supplies a gas containing at least one of a noble gas, nitrogen, oxygen and air or a mixed gas of two or more of them into said reaction vessel as the plasma generation gas.

17. The plasma treatment apparatus as set forth in claim 1, comprising a radiator for cooling said insulating member.

18. The plasma treatment apparatus as set forth in claim 1, comprising a temperature regulator configured to control temperature of said insulating member at a temperature where secondary electrons are easily emitted.

19. The plasma treatment apparatus as set forth in claim 1, comprising gas uniforming means configured to supply the plasma generation gas into all of said through holes at a uniform flow rate.

20. The plasma treatment apparatus as set forth in claim 1, wherein neutral grounding is formed between a first electric power source connected to one of said electrode plates, and a second electric power source connected to the other electrode plate.

* * * * *